US011665929B2

(12) United States Patent
Ahmed

(10) Patent No.: US 11,665,929 B2
(45) Date of Patent: May 30, 2023

(54) MICRO LIGHT-EMITTING DIODE DISPLAYS WITH IMPROVED POWER EFFICIENCY

(71) Applicant: Intel Corporation, Santa Clara, CA (US)

(72) Inventor: Khaled Ahmed, Anaheim, CA (US)

(73) Assignee: Intel Corporation, Santa Clara, CA (US)

( * ) Notice: Subject to any disclaimer, the term of this patent is extended or adjusted under 35 U.S.C. 154(b) by 838 days.

(21) Appl. No.: 16/440,824

(22) Filed: Jun. 13, 2019

(65) Prior Publication Data

US 2020/0395423 A1    Dec. 17, 2020

(51) Int. Cl.
*H01L 33/50* (2010.01)
*H01L 27/15* (2006.01)
*H01L 25/075* (2006.01)
*H01L 27/32* (2006.01)
*H01L 33/34* (2010.01)

(52) U.S. Cl.
CPC ........ *H01L 27/3246* (2013.01); *H01L 27/156* (2013.01); *H01L 27/3262* (2013.01); *H01L 33/34* (2013.01); *H01L 33/502* (2013.01); *H01L 25/0753* (2013.01)

(58) Field of Classification Search
CPC ............... H01L 27/3246; H01L 27/156; H01L 27/3262; H01L 33/34; H01L 33/502; H01L 25/0753; H01L 2933/0091; H01L 33/44
See application file for complete search history.

(56) References Cited

U.S. PATENT DOCUMENTS

| 8,045,107 | B2 * | 10/2011 | Tang | G02F 1/195 |
| | | | | 359/290 |
| 8,216,872 | B1 * | 7/2012 | Shieh | H01L 31/056 |
| | | | | 438/69 |
| 11,073,697 | B1 * | 7/2021 | Sharma | G02F 1/061 |
| 11,227,964 | B2 * | 1/2022 | Needell | H01L 31/048 |
| 11,404,492 | B2 * | 8/2022 | Song | H01L 33/50 |
| 2008/0237612 | A1 * | 10/2008 | Cok | H01L 51/5246 |
| | | | | 257/E33.001 |
| 2011/0042697 | A1 * | 2/2011 | Lee | H01L 27/322 |
| | | | | 257/89 |
| 2012/0266942 | A1 * | 10/2012 | Komatsu | C09K 11/7734 |
| | | | | 252/301.36 |
| 2013/0278199 | A1 * | 10/2013 | Otani | H02P 6/28 |
| | | | | 318/599 |

(Continued)

FOREIGN PATENT DOCUMENTS

CN      105794322 B  *  4/2018  .......... H01L 27/3211
WO   WO-2013183751 A1 * 12/2013  ....... G02F 1/133617

*Primary Examiner* — Mamadou L Diallo
(74) *Attorney, Agent, or Firm* — Schwabe, Williamson & Wyatt P.C.

(57) ABSTRACT

Micro light-emitting diode displays and methods of fabricating micro LED displays are described. In an example, a micro light emitting diode pixel structure includes a plurality of micro light emitting diode devices in a dielectric layer. Each of the micro light emitting diode devices have Mie scattering particles thereon. A transparent conducting oxide layer is above the dielectric layer and on the Mie scattering particles. A binder material layer is above the transparent conducting oxide layer. The binder material layer has a plurality of Rayleigh scattering particles therein.

25 Claims, 19 Drawing Sheets

(56) References Cited

U.S. PATENT DOCUMENTS

| | | | | |
|---|---|---|---|---|
| 2013/0293123 A1* | 11/2013 | Deak, Sr. | H01L 25/048 | 977/774 |
| 2014/0048779 A1* | 2/2014 | Lee | H01L 51/5262 | 257/89 |
| 2014/0154475 A1* | 6/2014 | Yukumoto | B01L 3/502715 | 156/293 |
| 2014/0266122 A1* | 9/2014 | Zhu | H02M 3/156 | 323/284 |
| 2015/0204490 A1* | 7/2015 | Zheng | H01L 25/0753 | 362/235 |
| 2015/0333221 A1* | 11/2015 | Bibi | G09F 9/301 | 438/34 |
| 2016/0104827 A1* | 4/2016 | Hong | H01L 33/504 | 349/71 |
| 2016/0154170 A1* | 6/2016 | Thompson | G02B 6/0073 | 362/555 |
| 2016/0161088 A1* | 6/2016 | Sung | H01L 33/502 | 362/97.1 |
| 2016/0306255 A1* | 10/2016 | Boyd | G02B 27/1006 | |
| 2017/0263828 A1* | 9/2017 | Mao | H01L 33/502 | |
| 2017/0294614 A1* | 10/2017 | Jia | H01L 51/5281 | |
| 2017/0354969 A1* | 12/2017 | Lionberger | B01L 3/502715 | |
| 2018/0026168 A1* | 1/2018 | Lenef | H01L 33/60 | 257/91 |
| 2018/0061743 A1* | 3/2018 | Hsu | H05K 1/0283 | |
| 2018/0100793 A1* | 4/2018 | Ichiki | G01N 15/14 | |
| 2019/0008388 A1* | 1/2019 | Ando | G01J 3/0264 | |
| 2019/0267574 A1* | 8/2019 | Gunbas | H01L 51/5268 | |
| 2020/0051959 A1* | 2/2020 | Pschenitzka | H01L 33/505 | |
| 2020/0365777 A1* | 11/2020 | Sasaki | H01L 21/6835 | |
| 2021/0082995 A1* | 3/2021 | Ikeda | H01L 33/387 | |
| 2021/0317326 A1* | 10/2021 | Doherty | G03F 7/0042 | |
| 2022/0020821 A1* | 1/2022 | Kim | H01L 27/323 | |
| 2022/0029059 A1* | 1/2022 | Kishimoto | H01L 27/156 | |
| 2022/0181587 A1* | 6/2022 | Kong | H01L 51/5271 | |
| 2022/0223654 A1* | 7/2022 | Ryu | G02B 5/201 | |

* cited by examiner

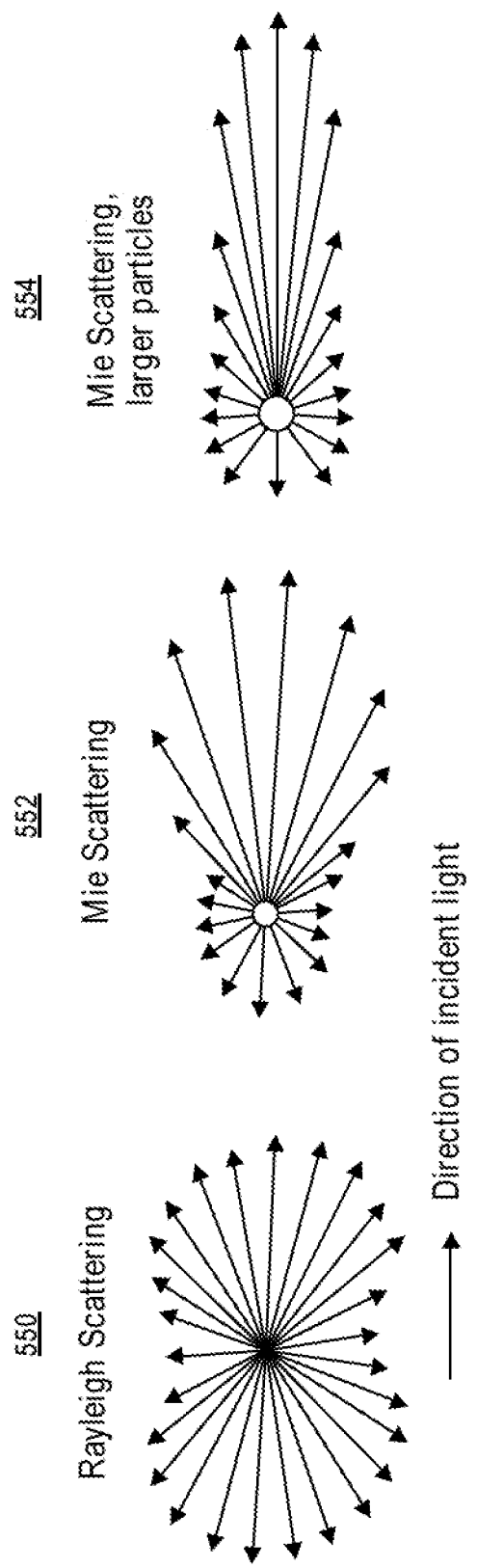

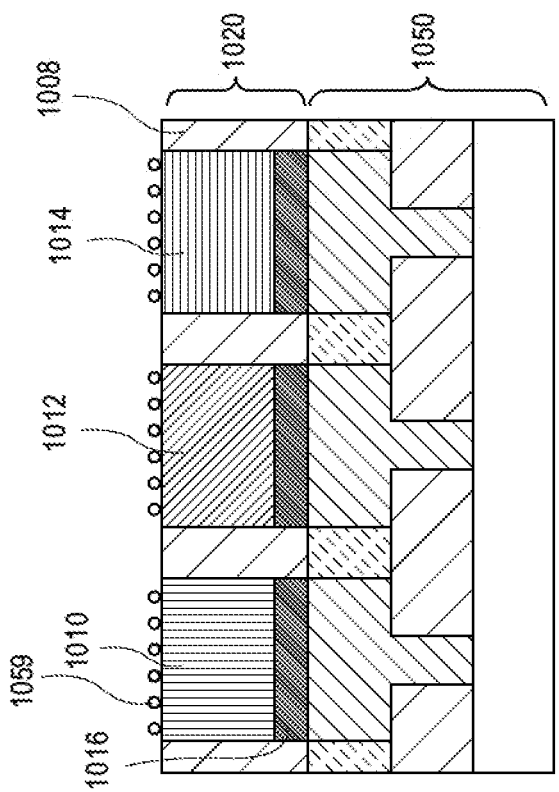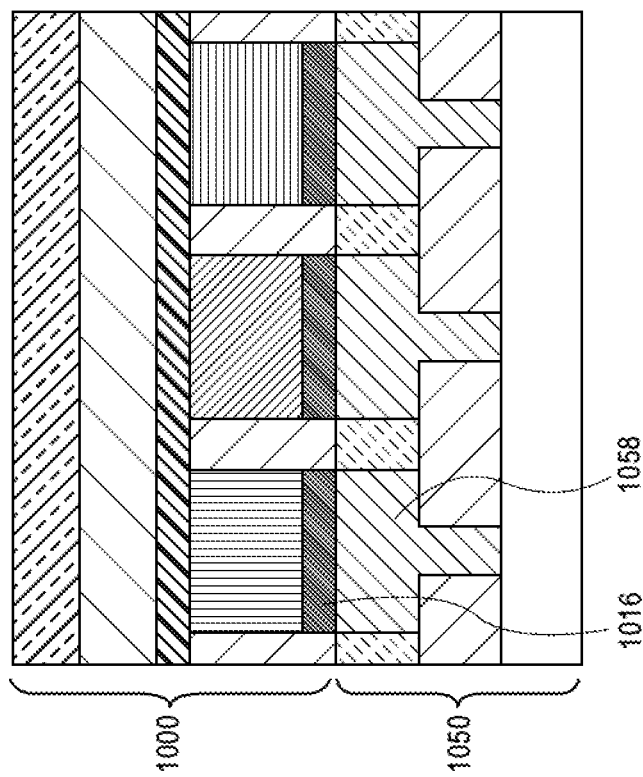
FIG. 10C
FIG. 10D

MICRO LIGHT-EMITTING DIODE DISPLAYS WITH IMPROVED POWER EFFICIENCY

TECHNICAL FIELD

Embodiments of the disclosure are in the field of micro-LED devices and, in particular, micro light-emitting diode displays with improved power efficiency.

BACKGROUND

Displays having micro-scale light-emitting diodes (LEDs) are known as micro-LED, mLED, and µLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a two-dimensional (2D) matrix, and are represented using dots, squares, rectangles, or other shapes. Pixels may be the basic building blocks of a display or digital image and with geometric coordinates.

BRIEF DESCRIPTION OF THE DRAWINGS

FIG. 5B is a schematic illustration of various light scattering modes, in accordance with an embodiment of the present disclosure

FIGS. 10A-10E illustrate cross-sectional views representing various operations in a method of fabricating a micro light emitting diode pixel structure, in accordance with an embodiment of the present disclosure.

DESCRIPTION OF THE EMBODIMENTS

Figure 1:
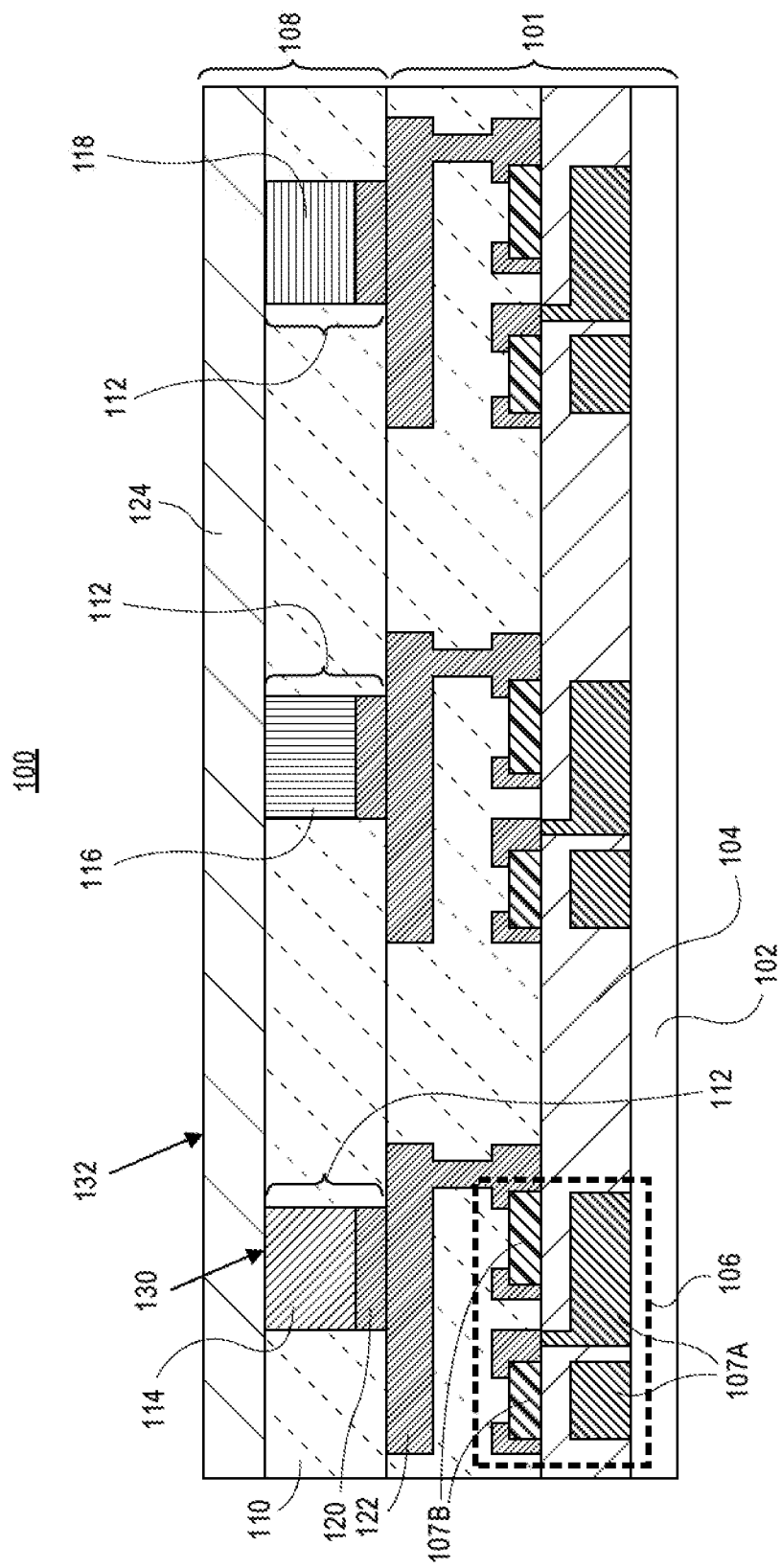
FIG. 1 illustrates a cross-sectional view of a pixel structure exhibiting internal reflection.

Micro light-emitting diode (LED) displays and methods of fabricating micro LED displays are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to devices and architectures for micro LED displays. To provide context, displays based on inorganic micro LEDs (µLEDs) have attracted increasing attention for applications in emerging portable electronics and wearable computers such as head-mounted displays and wristwatches. Micro LEDs are typically first manufactured on Sapphire or silicon wafers (for example) and then transferred onto a display backplane glass substrate where on which active matrix thin-film transistors have been manufactured.

Micro LED displays promise 3×-5× less power compared to organic LED (OLED) displays. The difference would result in a savings in battery life in mobile devices (e.g., notebook and converged mobility) and can enhance user experience. In an embodiment, micro LED displays described herein consume two-fold less power compared to organic LED (OLED) displays. Such a reduction in power consumption may provide approximately 8 hours of additional battery life. Such a platform may even outperform platforms based on low power consumption central processing units (CPUs). Embodiments described herein may be associated with one or more advantages such as, but not limited to, high manufacturing yield, high manufacturing throughput (display per hour), and applicability for displays with a diagonal dimension ranging from 2 inches to 15.6 inches.

In a first aspect of the present disclosure, structures for improved power efficiency micro LED displays are described.

The "display" is the window for central processing unit (CPU) products in the PC business. Embodiments described herein may be applicable to fabricating low-power micro LED displays for use in Converged Mobility computing devices powered by CPUs. Currently, micro LED displays require improved optical design to maximize power efficiency. According to Snell's law, if the incident angle of light passing from a high refractive index medium to a low refractive index medium is larger than a critical angle, then the light undergoes total internal reflection such that it cannot enter the low refractive index medium. Most light emitted by a light emitting diode is subjected to the total internal reflection issue so as to decrease the overall emission efficiency of the light emitting diode. Embodiments described herein may be implemented to provide manufacturable micro LED display device structures with approximately 2× higher light extraction efficiency compared to state-of the-art display structures, such as OLED displays or GaN-based nanowire LEDs with low light extraction efficiency, where display power consumption is much higher than desired.

As a comparative example, FIG. 1 illustrates a cross-sectional view of a pixel structure exhibiting internal reflection.

Referring to FIG. 1, a pixel structure 100 includes a backplane 101. The backplane 101 includes a glass substrate 102 having an insulating layer 104 thereon. Pixel thin film transistor (TFT) circuits 106 are included in and on the insulating layer 104. Each of the pixel TFT circuits 106 includes gate electrodes 107A and channels 107B. A portion of the insulating layer 104 may act as a gate dielectric for each of the pixel TFT circuits 106. A conductive mirror 122 is over each of the TFT circuits 106.

Referring again to FIG. 1, the pixel structure 100 includes a front plane 108 on the backplane 101. The front plane 108 includes LEDs in a dielectric layer 110. In the example shown, three micro LEDs 112 are included. Each micro LED includes a corresponding micro light emitting diode device 114, 116 or 118 on a conductive interconnect structure 120, such as a conductive bump. The front plane 108 also includes a transparent conducting oxide layer 124. Arrows 130 and 132 indicate the interfaces at which total internal reflection (TIR) loss is expected. TIR loss can result in poor power efficiency for micro LED displays.

In accordance with an embodiment of the present disclosure, display power efficiency is improved using light scattering particles (LSPs) of different sizes and/or different indices of refraction on top of micro LED surfaces. Light scattering particles can reduce total internal reflection (TIR) and improve extraction efficiency (e.g., as a replacement of texturing). Scattering the micro LED light by Mie scattering can cause the light to be more likely to escape the passivation layer without any internal reflection (or with only a few internal reflections) at an interface with air. In one embodiment, Mie scattering is most efficient when the particle size is equal to the wavelength of incident light. However, the size of the particles may be less than the incident light wavelength and still exhibit Mie scattering.

In accordance with another or an additional embodiment of the present disclosure, a light diffusive layer is printed over a transparent conductor layer. The light diffusive layer may act to mitigate issues with TIR in the transparent conductor layer. In one embodiment, the diffusive layer contains dielectric nanoparticles, such as $TiO_2$ particles, in a transparent binder. The dielectric nanoparticles can be referred to as Rayleigh scattering particles. The difference in the indices of refraction between the binder and the particles can be relatively high to tune the refractive index of transparent conducting oxide (TCO) coating material to act as an anti-reflective coating.

In an embodiment, Mie scattering particles are of a size in the range of 0.2-0.5 times the wavelength of visible light (e.g., red=630 nm, green=540 nm, and blue=460 nm). These particles can be composed of a high refractive index material such as $TiO_2$. The Rayleigh scattering particles can be of a size in the range of 4 nm to 15 nm and can be composed of high refractive index materials such as $ZrO_2$ or $TiO_2$ or $SiO_2$. A combination of different materials is also possible. In a particular embodiment, the binder material can be any material that is transparent to visible light with a refractive index between 1.2 and 1.5.

Figure 2:
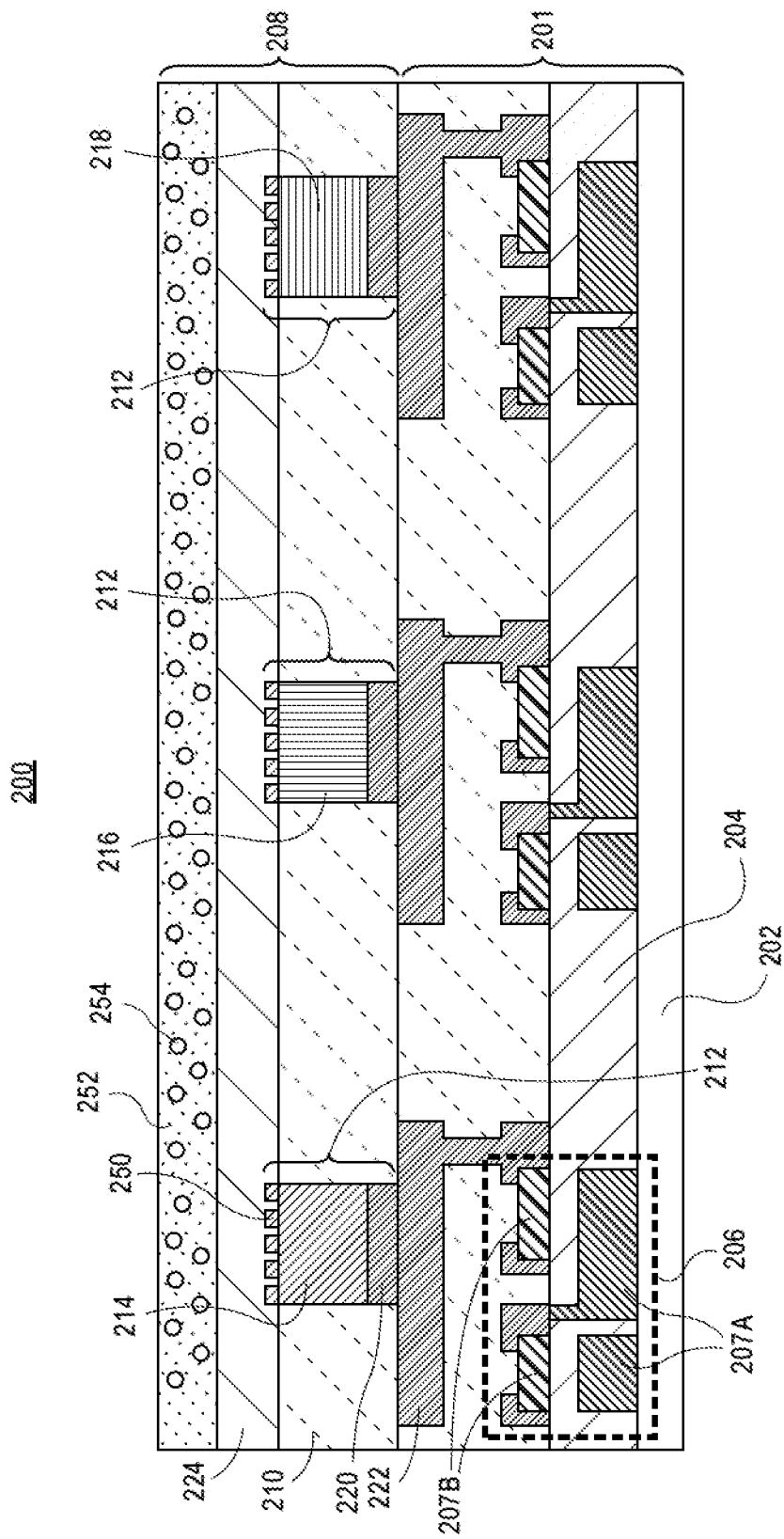
FIG. 2 illustrates a cross-sectional view of a pixel structure including Mie scattering particles and Rayleigh scattering particles, in accordance with an embodiment of the present disclosure.

As an exemplary pixel architecture, FIG. 2 illustrates a cross-sectional view of a pixel structure including Mie scattering particles and Rayleigh scattering particles, in accordance with an embodiment of the present disclosure.

Referring to FIG. 2, a pixel structure 200 includes a backplane 201. The backplane 201 includes a glass substrate 202 having an insulating layer 204 thereon. Pixel thin film transistor (TFT) circuits 206 are included in and on the insulating layer 204. Each of the pixel TFT circuits 206 includes gate electrodes 207A, such as metal gate electrodes, and channels 207B, such as polycrystalline silicon channels or IGZO channels. A portion of the insulating layer 204 may act as a gate dielectric for each of the pixel TFT circuits 206. A conductive mirror 222 is over each of the TFT circuits 206.

Referring again to FIG. 2, the pixel structure 200 includes a front plane 208 on the backplane 201. The front plane 208 includes LEDs in a dielectric layer 210, such as a carbon-doped oxide layer. In the example shown, three micro LEDs 212 are included. Each micro LED includes a corresponding micro light emitting diode device 214, 216 or 218 on a conductive interconnect structure 220, such as a conductive bump. In a particular embodiment, micro light emitting diode devices 214, 216 and 218 are blue, green and red micro light emitting diode devices, respectively. It is to be appreciated that other arrangements may be used, including variation in number and/or colors of micro LED devices included. The front plane 208 also includes a transparent conducting oxide layer 224, such as a layer of indium tin oxide (ITO), as a cathode of the pixel structure 200. In an embodiment, each of the micro light emitting diode devices have Mie scattering particles 250 thereon. In an embodiment, a binder material layer 252 is above the transparent conducting oxide layer 224. The binder material layer 252 has a plurality of Rayleigh scattering particles 254 therein.

In an embodiment, each of the pixel TFT circuits 206 is a circuit such as circuit 1200, described below. Embodiments described herein may be based only on the back plane 201 described above. Embodiments described herein may be based only on the front plane 208 described above.

With reference again to FIG. 2, in accordance with an embodiment of the present disclosure, a micro light emitting diode pixel structure 200 includes a plurality of micro light emitting diode devices 214, 216, 218 in a dielectric layer 210. Each of the micro light emitting diode devices 214, 216, 218 have Mie scattering particles 250 thereon. A transparent conducting oxide layer 224 is above the dielectric layer 210 and on the Mie scattering particles 250. A binder material layer 252 is above the transparent conducting oxide layer 224. The binder material layer 252 has a plurality of Rayleigh scattering particles 254 therein.

In an embodiment, the Mie scattering particles 250 are titanium dioxide ($TiO_2$) particles. In an embodiment, the Mie scattering particles 250 each have a diameter in the range of 0.2-0.5 of the wavelength of light of one or more of the plurality of micro light emitting diode devices 214, 216, 218. In an embodiment, the Rayleigh scattering particles are titanium dioxide ($TiO_2$) particles, silicon dioxide ($SiO_2$) particles, or zirconium oxide ($ZrO_2$) particles. In an embodiment, the Rayleigh scattering particles 254 have a diameter in the range of 4 nanometers-15 nanometers.

In an embodiment, the binder material layer 252 is transparent to visible light and has a refractive index between 1.2 and 1.5. In an embodiment, the binder material layer 252 is selected from the group consisting of an epoxy layer, a polycarbonate layer, and a polyolefin layer.

In an embodiment, the plurality of micro light emitting diode devices 214, 216, 218 includes a blue micro light emitting diode device, a green micro light emitting diode device, and a red micro light emitting diode device. In an embodiment, the plurality of micro light emitting diode devices 214, 216, 218 is a plurality of GaN nanowire-based or nanopyramid-based micro light emitting diode devices.

In an embodiment, the plurality of micro light emitting diode devices 214, 216, 218, the transparent conducting oxide layer 224, and the binder material layer 252 form a front plane 208 of the micro light emitting diode pixel structure 200. The micro light emitting diode pixel structure 200 further includes a backplane 201 beneath the front plane 208. The backplane 201 includes a glass substrate 202 having an insulating layer 204 thereon. A plurality of pixel thin film transistor circuits 206 is in and on the insulating layer 204. Each of the pixel thin film transistor circuits 206 includes a gate electrode 207A and a channel 207B, such as a channel including polycrystalline silicon or indium gallium zinc oxide (IGZO). In one embodiment, each of the pixel thin film transistor circuits 206 is to drive at least one of the plurality of micro light emitting diode devices 214, 216, 218. In one embodiment, each of the pixel thin film transistor circuits 206 includes a current mirror and a linearized transconductance amplifier coupled to the current mirror, as described in greater detail below.

Advantages of implementing embodiments described herein may include the fabrication of a relatively lower power consumption display with excellent color gamut and display lifetime. To provide context, the demand for low power in consumer electronic devices has increased dramatically in the past ten years due to limited battery lifespan. One of the components with the highest percentage of total energy consumption, and therefore a suitable candidate for improvement, is the display. The development of low power displays is becoming a high priority for the consumer electronics industry. Micro LED (μLED) display is a type of emissive display technology that uses a matrix of individually-switched self-illuminating inorganic diodes that can be controlled and lit without a master backlight. Inorganic μLEDs have a number of potential advantages over organic LEDs (OLEDs) for display applications. These include the possibility of high brightness. In μLED displays, a desired color and luminance value are created from various combinations of three colors of light emitting elements (red, green and blue).

Figure 3:
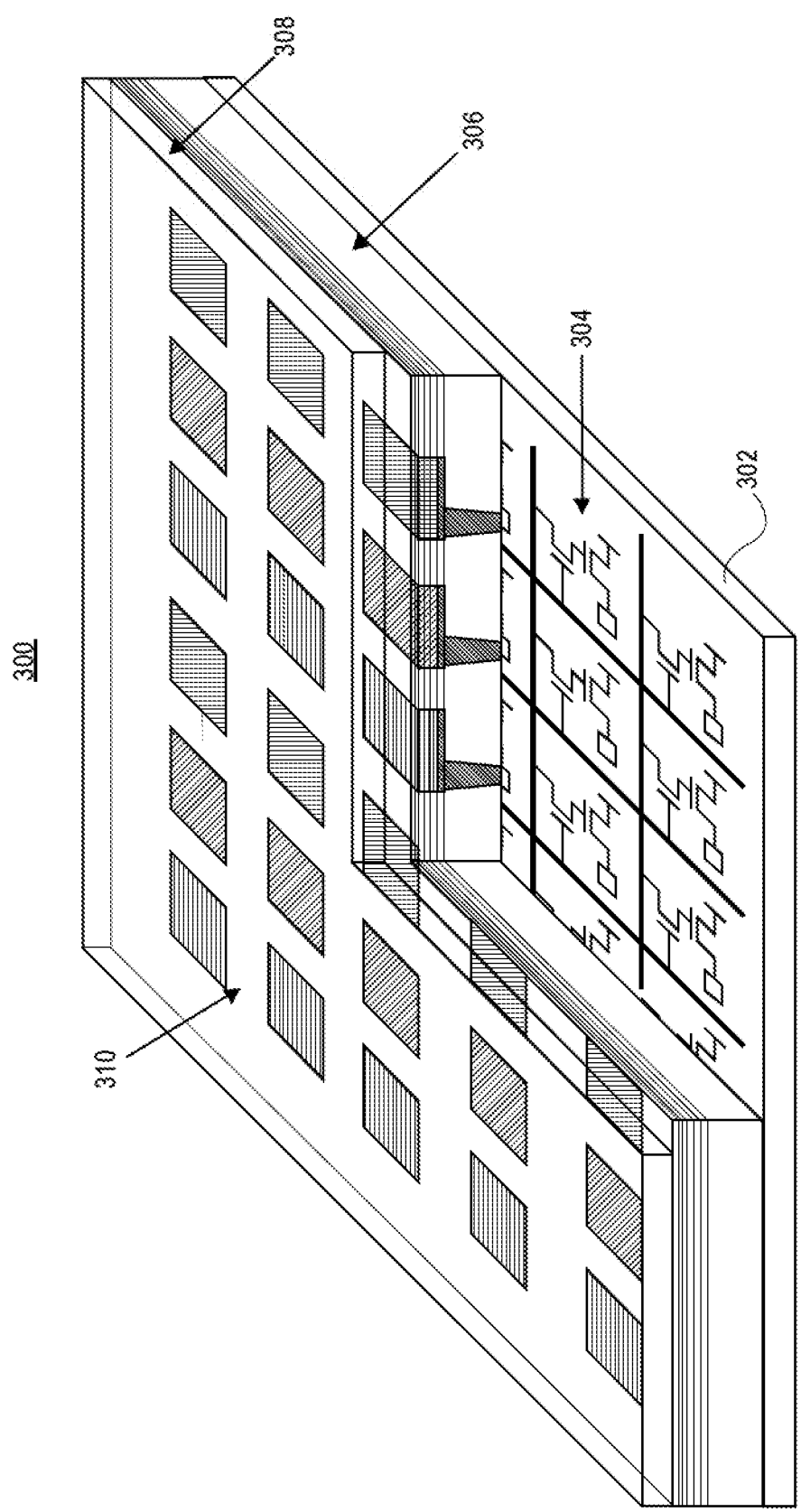
FIG. 3 illustrates a schematic of micro LED or OLED display architecture, in accordance with an embodiment of the present disclosure.

As an exemplary display architecture, FIG. 3 illustrates a schematic of micro LED or OLED display architecture, in accordance with an embodiment of the present disclosure.

As an exemplary display architecture, FIG. 3 illustrates a schematic of micro LED or OLED display architecture, in accordance with an embodiment of the present disclosure. Referring to FIG. 3, a micro LED or OLED display 300 includes a backplane 302 having pixel circuits 304 thereon. An insulator 306 is over the pixel circuits 304. Micro LED layers 308 are included over the insulator 306. A transparent electrode 310 is over the micro LED layers 308.

To provide further context, there are generally three ways that light scattering particles (LSPs) scatter light: reflection, refraction and diffraction.

Reflection is the change in direction of light at an interface between media having different indices of refraction so that the light returns into the medium from which it originated. As light traveling in a medium reaches an interface with another material having a different index of refraction, the light is deflected back into the medium. In the case of LSPs, the light can be deflected back in the direction it came from or at an angle to the side, depending on where the light hits the particle. For purposes of scattering light that will eventually be emitted, sideways scattering may be preferred so that the amount of light reflected backwards (backscattering) towards absorbent materials is reduced.

Refraction is the change in direction of light due to a change in phase velocity (i.e., the speed a wave propagates in a medium). In this context, refraction takes place when light travels from one medium to another medium having a different index of refraction. In one embodiment, light is emitted into an encapsulant medium where it interacts with LSPs distributed throughout the medium. As the light enters the LSPs, it changes speed, resulting in a change of direction, scattering.

Diffraction is the bending of light around an object or an aperture due to the wave-like characteristics of light. As light passes close by an object, for example an LSP, the light bends around the object, deviating from its original path as it was approaching the object. With large objects the bending effect is barely noticeable. However, as the size of the object approaches the wavelength of the incident light, the phenomenon becomes significant. In this context, when the size of the LSPs approaches one half the wavelength of the incident light, the light can bend approximately five times as much light as actually strikes the object. Thus, with an appropriately sized LSP, the diffraction area around the particle can be increased to approximately five times the diameter of the particle. To take advantage of the increased diffraction cross-section, the size of the LSP is carefully chosen for light having a particular wavelength range or sub-range.

It is to be appreciated that the size of the particles may play a role in the effectiveness of embodiments described herein. When the particles are less than 1/10th of the wavelength of the incident light (i.e., λ/10) in size, the scattered light carries some energy (i.e., elastic scattering) to the incident light and is not angle-dependent (i.e., Rayleigh scattering). However, when the size of the particles exceeds this threshold of λ/10 then Rayleigh scattering is replaced by anisotropic Mie scattering where the scattered light is unequal in energy (i.e., inelastic scattering) to the incident light and angle-dependent where the scattered light is most intense towards the direction of the incident light. The above size threshold (λ/10) can be due to the way electromagnetic waves (e.g., light) interact with a particle.

Figure 4:
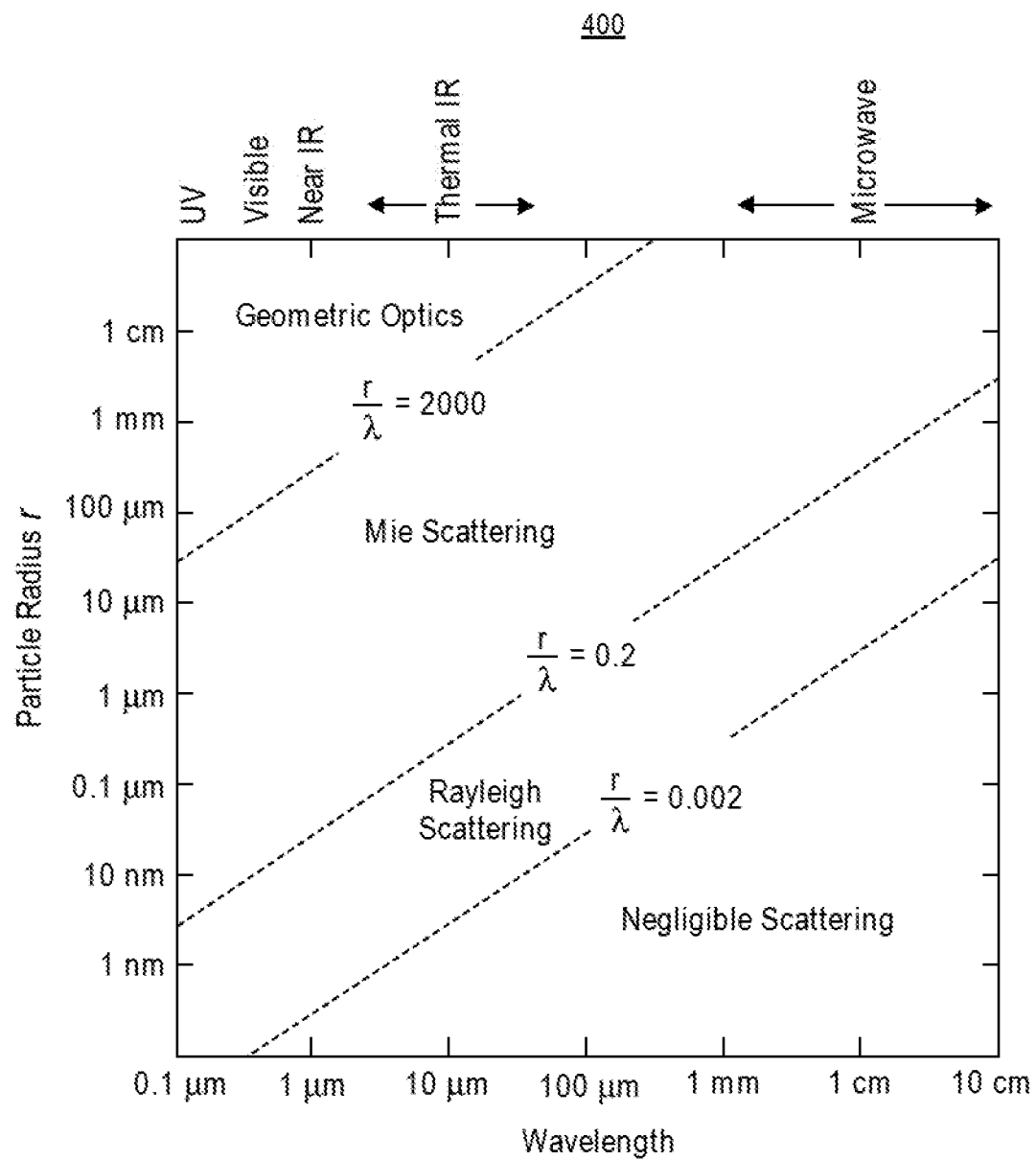
FIG. 4 is a plot showing the dominant scattering mechanisms of light by particles, in accordance with an embodiment of the present disclosure.

FIG. 4 is a plot 400 showing the dominant scattering mechanisms of light by particles, in accordance with an embodiment of the present disclosure. Mie scattering is dominant for particles having sizes (radius r) of the order of the wavelength of incident light. For example, a blue light with wavelength of 460 nanometers can be experience anisotropic scattering (i.e. Mie scattering) if the scattering particles have radius between 40 nm and 800 nm. Particles of diameters less than 10 nanometers can be scattered isotropically according the Rayleigh scattering model.

Figure 5A:
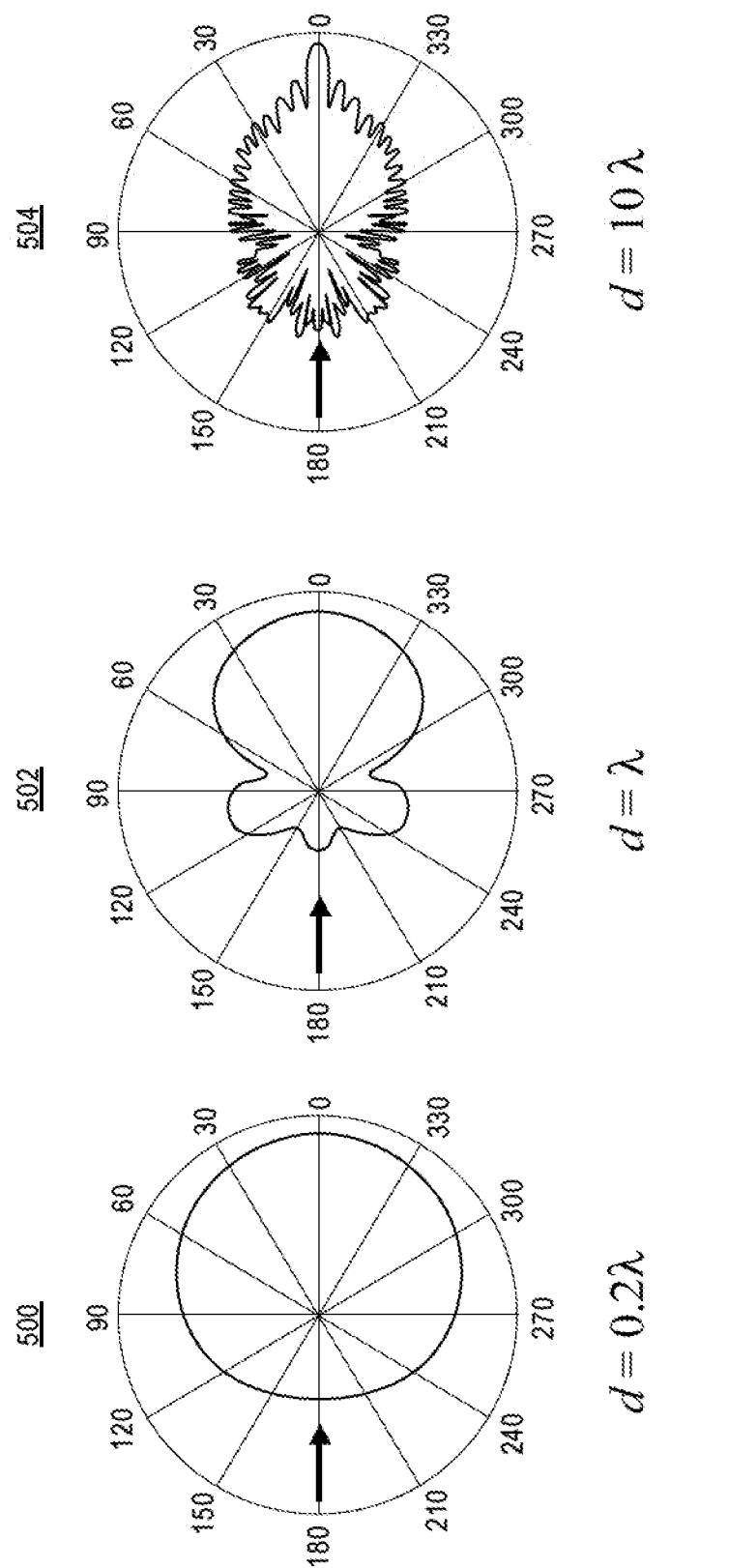
FIG. 5A includes Mie scattering diagrams for different diameters of scattering particles (d) given in terms of incident light wavelength), in accordance with an embodiment of the present disclosure.

FIG. 5A includes Mie scattering diagrams 500, 502 and 504 for different diameters of scattering particles (d) given in terms of incident light wavelength λ, in accordance with an embodiment of the present disclosure. When the size of the particle is close to the wavelength, anisotropic scattering is produced. FIG. 5B is a schematic illustration of various light scattering modes 550, 552 and 554, in accordance with an embodiment of the present disclosure. Rayleigh scattering is isotropic and Mie scattering is anisotropic.

In accordance with an embodiment of the present disclosure, Mie scattering particles described herein are core-shell spheres or derivative shapes having a dielectric core and metal shell. In one embodiment, the dielectric is $TiO_2$, doped $TiO_2$, $ZrO_2$, or doped $ZrO_2$. In an embodiment, the Mie scattering particles have a size (e.g., a diameter) of 45 nm-650 nm. It is to be appreciated that embodiments of the disclosure are often described herein with reference to cross-sectional view illustrations that are schematic illustrations of idealized embodiments of the disclosure. Variations from the shapes of the illustrations as a result, for example, of manufacturing techniques and/or tolerances may be expected, and are considered within the spirit and scope of embodiments of the present disclosure. For example, a region illustrated or described as rectangular, for example, can often have rounded or curved features due to normal manufacturing tolerances. Thus, the regions illustrated in the figures are schematic in nature and their shapes are not intended to illustrate the precise shape of a region or particle and are not intended to limit the scope of the disclosure.

In accordance with an embodiment of the present disclosure, Rayleigh scattering particles described herein are nanoparticles spheres (or derivative shapes) with a diameter in the range of 4 nm-15 nm. In an embodiment, suitable materials include $ZrO_2$, doped $ZrO_2$, $TiO_2$ and/or doped $TiO_2$.

It is to be appreciated that the inventor has discovered that light extraction from a light-emitting semiconductor device may be increased by dispersing nanoparticles that are much smaller than a wavelength (e.g., peak wavelength) of the light emitted by the device into a host material and disposing the mixture on the common cathode (e.g., indium tin oxide (ITO)) layer. The nanoparticles are chosen to have a refractive index greater than that of the host material. The incorporation of the nanoparticles can result in an increase of the "effective refractive index" from 1.4 (for example) to 1.8 (for example) which reduces total internal reflection at the ITO/passivation dielectric interface. The increase in refractive index accomplished by dispersing higher refractive index nanoparticles into a lower refractive index host material may be understood in terms of effective medium theory, where optical and dielectric properties of a mixture can be described in terms of the properties of its constituent components. The refractive index of a mixture, for example, may be well approximated by a volume weighted average of the refractive indices of its components if the mixture may be treated as a host material including non-scattering portions of other materials.

It is to be appreciated that the concepts described above can be extended to cover the situations where a color conversion layer is used to convert blue light (from a blue micro LED) to red light in lieu of including a red LED. As an example of such a pixel architecture, FIG. 6 illustrates a cross-sectional view of a pixel structure including Mie scattering particles, Rayleigh scattering particles, and a quantum dot layer, in accordance with an embodiment of the present disclosure.

Figure 6:
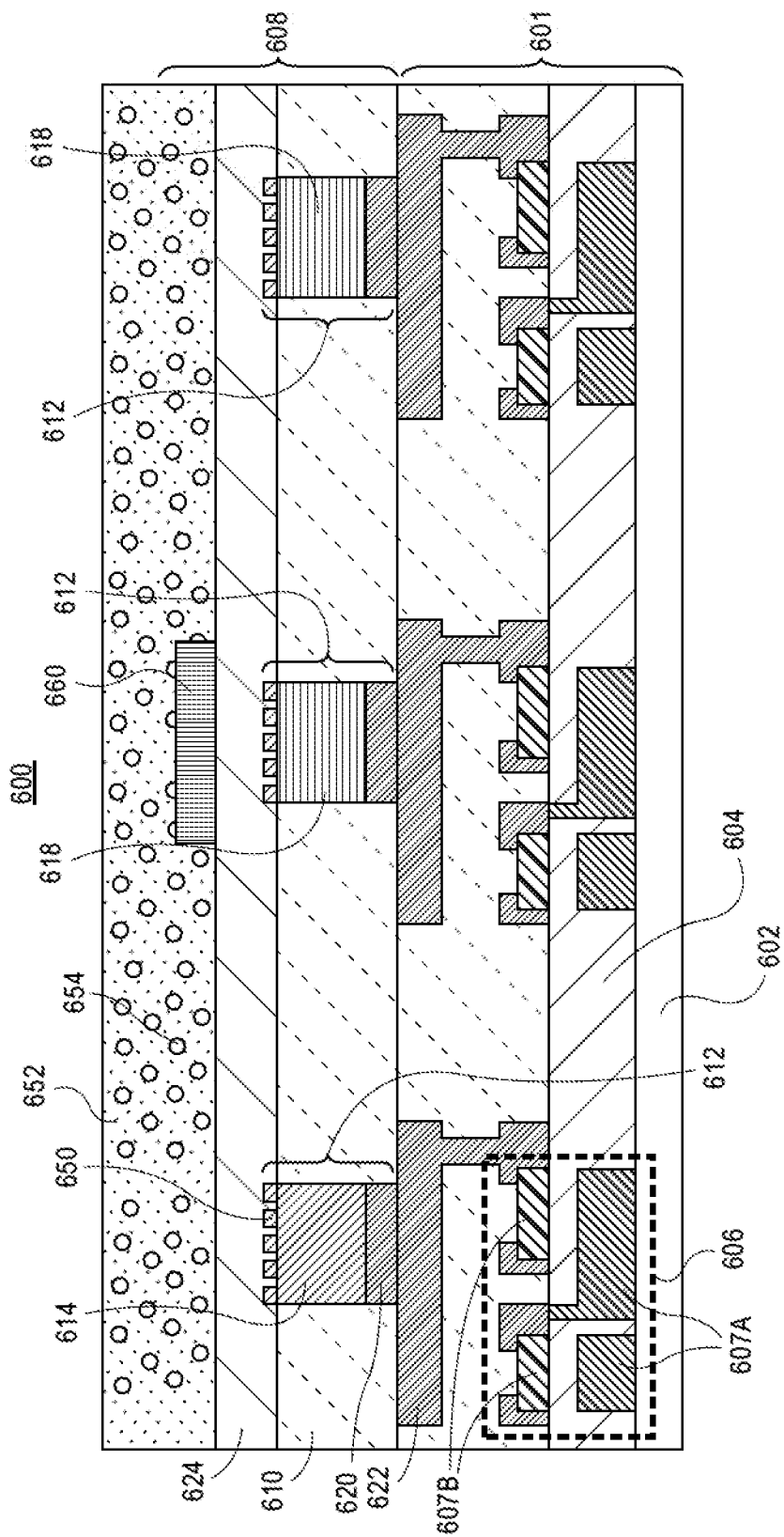
FIG. 6 illustrates a cross-sectional view of a pixel structure including Mie scattering particles, Rayleigh scattering particles, and a quantum dot layer, in accordance with an embodiment of the present disclosure.

Referring to FIG. 6, a pixel structure 600 includes a backplane 601. The backplane 601 includes a glass substrate 602 having an insulating layer 604 thereon. Pixel thin film transistor (TFT) circuits 606 are included in and on the insulating layer 604. Each of the pixel TFT circuits 606 includes gate electrodes 607A, such as metal gate electrodes, and channels 607B, such as polycrystalline silicon channels or IGZO channels. A portion of the insulating layer 604 may act as a gate dielectric for each of the pixel TFT circuits 606. A conductive mirror 622 is over each of the TFT circuits 606.

Referring again to FIG. 6, the pixel structure 600 includes a front plane 608 on the backplane 601. The front plane 608 includes LEDs in a dielectric layer 610, such as a carbon-doped oxide layer. In the example shown, three micro LEDs 612 are included. Each micro LED includes a corresponding micro light emitting diode device 614, 618 (2 shown) on a conductive interconnect structure 620, such as a conductive bump. In a particular embodiment, micro light emitting diode devices 614 and 618 (2 shown) are green, blue and blue micro light emitting diode devices, respectively. It is to be appreciated that other arrangements may be used, including variation in number and/or colors of micro LED devices included. The front plane 608 also includes a transparent conducting oxide layer 624, such as a layer of indium tin oxide (ITO), as a cathode of the pixel structure 600.

In an embodiment, each of the micro light emitting diode devices have Mie scattering particles 650 thereon. A binder material layer 652 is above the transparent conducting oxide layer 624. The binder material layer 652 has a plurality of Rayleigh scattering particles 654 therein. Also, a quantum dot layer 660 is included for conversion of the blue light of one of the blue LEDs 618 to red light.

In an embodiment, each of the pixel TFT circuits 606 is a circuit such as circuit 1200, described below. Embodiments described herein may be based only on the back plane 601 described above. Embodiments described herein may be based only on the front plane 608 described above.

In a second aspect of the present disclosure, three-dimensional micro LEDs with high extraction efficiency for micro LED displays are described.

To provide context, red green blue (RGB) gallium nitride (GaN) LED displays promise low power consumption, improved reliability, and improved color gamut compared to organic LED displays (OLEDs). Nanowire LEDs are currently not efficient enough due to low light extraction efficiency. Addressing such issues, in accordance with one or more embodiments of the present disclosure, nanowire device structures with about 2 times higher light extraction efficiency (relative to conventional nanowire structures) are described. It is to be appreciated that other attempts to address such issues have included the fabrication of OLED displays, or GaN-based nanowire LEDs with low light extraction efficiency. However, the display power consumption is typically higher than desired.

More particularly, in an embodiment, a nanowire or nanopyramid LED structure is disclosed herein where the nanowire sidewalls or nanopyramid cap are "decorated" conformally with high refractive index dielectric (e.g., $TiO_2$) nanoparticles with subwavelength size. The subwavelength texture can result in higher light extraction efficiency. Advantages of implementing embodiments described herein may include enabling the fabrication of a lower power consumption display with excellent color gamut and display lifetime. A significant component of the LED ecosystem is the thin film transistor (TFT) backplane based display. Embodiments described herein are directed to the TFT backplane based display component.

Figure 7A:
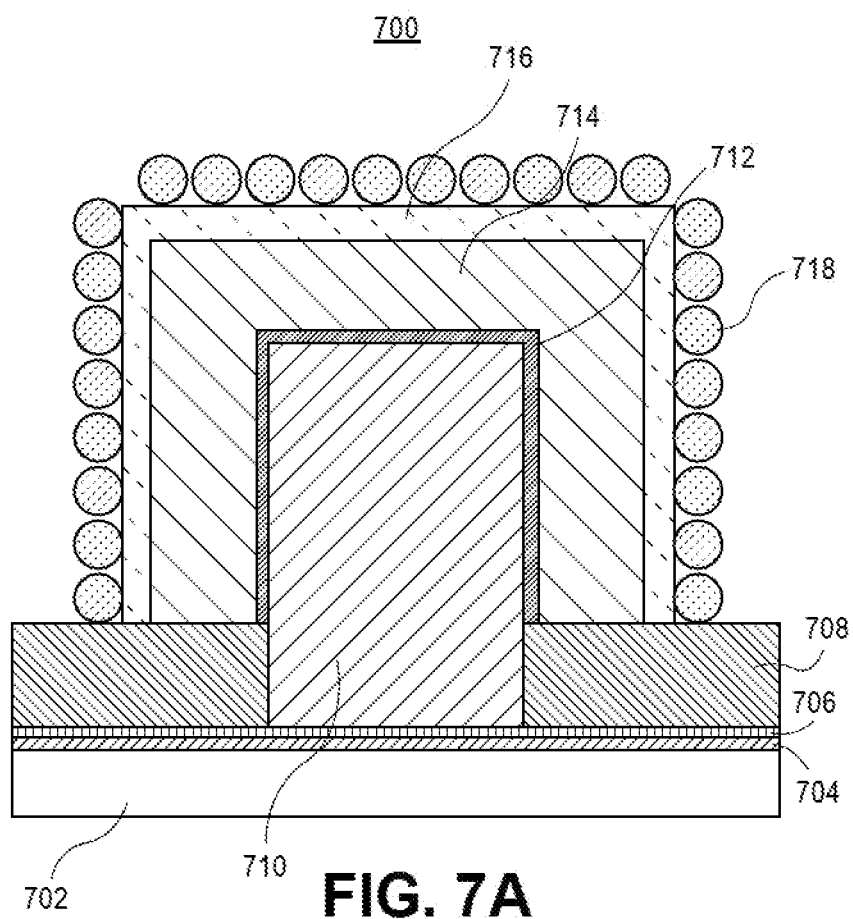
FIG. 7A illustrates a cross-sectional view of a nanowire LED formed on Si(111) wafer and having nanoparticles thereon, in accordance with an embodiment of the present disclosure.

As an example, FIG. 7A illustrates a cross-sectional view of a nanowire LED having nanoparticles thereon, in accordance with an embodiment of the present disclosure.

Referring to FIG. 7A, an LED structure 700 includes a substrate 702, such as a Si(111) substrate. A buffer layer or first nucleation layer 704, such as an aluminum nitride (AlN) layer, is on substrate 702. A top nucleation layer 706, such as a metal nitride (MN) nucleation layer is on the buffer layer or first nucleation layer 704. A mask or passivation layer 708, such as a silicon nitride layer, is on the top nucleation layer 706. An opening in the mask or passivation layer 708 exposes a portion of the top nucleation layer 706. A nanowire core 710, such as an N-type GaN (N-GaN) nanowire core, is in the opening in the mask or passivation layer 708 and on the exposed portion of the top nucleation layer 706. An active layer 712, such as an InGaN layer, is on exposed portions of the nanowire core 710. A top semiconductor layer 714, such as a P-type GaN (P-GaN) layer is on the active layer 712. A transparent conductive oxide (TCO) layer 716 is on the top semiconductor layer 714. Nanoparticles 718, such as $TiO_2$ particles, $SiO_2$ particles, or $ZrO_2$ particles, are on the TCO layer 716.

Figure 7B:
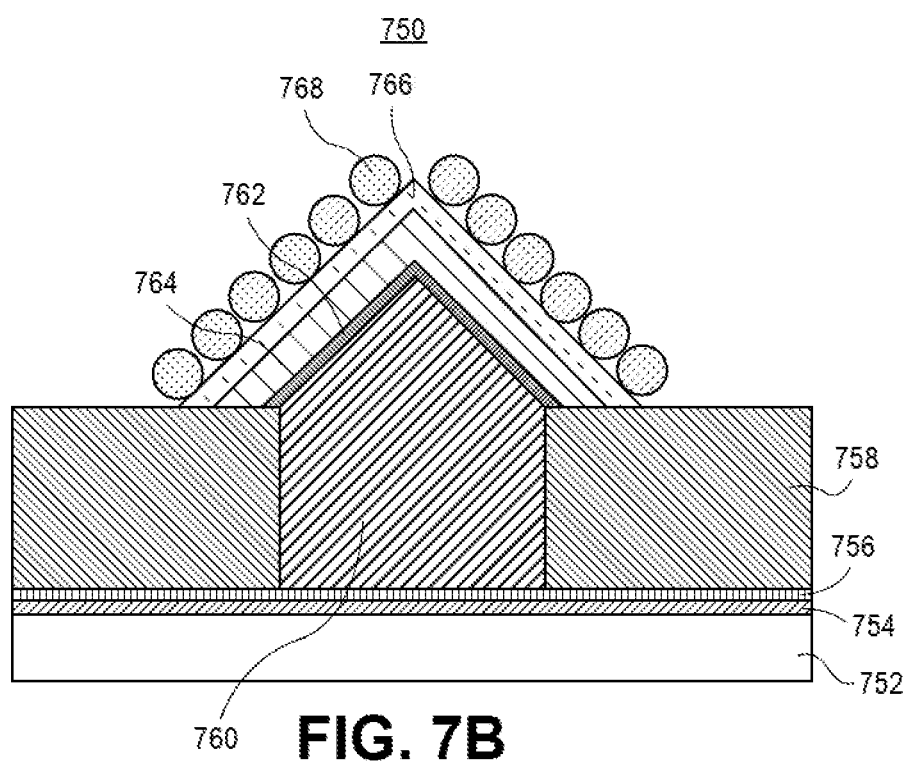
FIG. 7B illustrates a cross-sectional view of a nanopyramid LED formed on Si(111) wafer and having nanoparticles thereon, in accordance with an embodiment of the present disclosure.

As another example, FIG. 7B illustrates a cross-sectional view of a nanopyramid LED having nanoparticles thereon, in accordance with an embodiment of the present disclosure.

Referring to FIG. 7B, an LED structure 750 includes a substrate 752, such as a Si(111) substrate. A buffer layer or first nucleation layer 754, such as an aluminum nitride (AlN) layer, is on substrate 752. A top nucleation layer 756, such as a metal nitride (MN) nucleation layer is on the buffer layer or first nucleation layer 754. A mask or passivation layer 758, such as a silicon nitride layer, is on the top nucleation layer 756. An opening in the mask or passivation layer 758 exposes a portion of the top nucleation layer 756. A nanopyramid core 760, such as an N-type GaN (N-GaN) nanopyramid core, is in the opening in the mask or passivation layer 758 and on the exposed portion of the top nucleation layer 756. An active layer 762, such as an InGaN layer, is on exposed portions of the nanopyramid core 760. A top semiconductor layer 764, such as a P-type GaN (P-GaN) layer is on the active layer 762. A transparent conductive oxide (TCO) layer 766 is on the top semiconductor layer 764. Nanoparticles 768, such as $TiO_2$ particles or $ZrO_2$ particles, are on the TCO layer 766.

Referring again to FIGS. 7A and 7B, in an embodiment, a nanowire or nanopyramid surface is decorated by $TiO_2$ (or $ZrO_2$, for example) nanoparticles to create "subwavelength texture" that results in improved light extraction efficiency. The nanoparticle size may be in the range of 50 nm to 300 nm. The density coverage and size of nanoparticles may be engineered to tune the far-field radiation pattern from nanowire or nanopyramid LEDs. A mixture of nanoparticle materials (e.g. $ZrO_2$ and $TiO_2$) may be used to further optimize the light extraction efficiency of the nanowires or nanopyramids.

It is to be appreciated that the micro LEDs of FIGS. 7A and 7B are decorated by high refractive index nanoparticles (such as $TiO_2$ or $ZrO_2$ nanoparticles) before micro LEDs are transferred from silicon wafers to display backplane. In other embodiments, the micro LEDs of FIGS. 7A and 7B are decorated by high refractive index nanoparticles (such as $TiO_2$ or $ZrO_2$ nanoparticles) after micro LEDs are transferred from silicon wafers to display backplane. In either case, as an exemplary resulting structure, a micro light emitting diode pixel structure includes a plurality of micro light emitting diode devices of the type of FIG. 7A or 7B in a dielectric layer. A transparent conducting oxide layer is above the dielectric layer and over the plurality of micro light emitting diode devices. A plurality of dielectric nanoparticles is on the transparent conducting oxide layer and over the plurality of micro light emitting diode devices.

In an embodiment, the dielectric nanoparticles are titanium dioxide ($TiO_2$) particles, silicon dioxide ($SiO_2$) particles, zirconium oxide ($ZrO_2$) particles, or a combination thereof. In an embodiment, the dielectric nanoparticles each have a diameter in the range of 10 nanometers-300 nanometers. In an embodiment, the plurality of micro light emitting diode devices of the type in FIG. 7A or 7B includes a blue micro light emitting diode device, a green micro light emitting diode device, and a red micro light emitting diode device. In an embodiment, the plurality of micro light emitting diode devices is a plurality of GaN nanowire-based or nanopyramid-based micro light emitting diode devices.

In an embodiment, the plurality of micro light emitting diode devices of the type in FIG. 7A or 7B form a front plane of a micro light emitting diode pixel structure, and the micro light emitting diode pixel structure further includes a backplane beneath the front plane. In one embodiment, the backplane includes a glass substrate having an insulating layer thereon, and a plurality of pixel thin film transistor circuits in and on the insulating layer. Each of the pixel thin film transistor circuits includes a gate electrode and a channel which may include polycrystalline silicon or indium gallium zinc oxide (IGZO). In one embodiment, each of the pixel thin film transistor circuits is to drive at least one of the plurality of micro light emitting diode devices. In one embodiment, each of the pixel thin film transistor circuits includes a current mirror and a linearized transconductance amplifier coupled to the current mirror.

In an exemplary embodiment of the concepts described above, after transferring micro LEDs from a silicon wafer to a display backplane, nanoparticles (such as $TiO_2$) are used to decorate micro LEDs to induce light scattering, which can improve light extraction efficiency. After the formation of the nanoparticle coating, a planarization oxide can be deposited and a transparent electrode can be deposited to access the micro LED cathodes. As an exemplary structure, FIG. 8 illustrates a cross-sectional view of a micro LED pixel structure, in accordance with an embodiment of the present disclosure.

Figure 8:
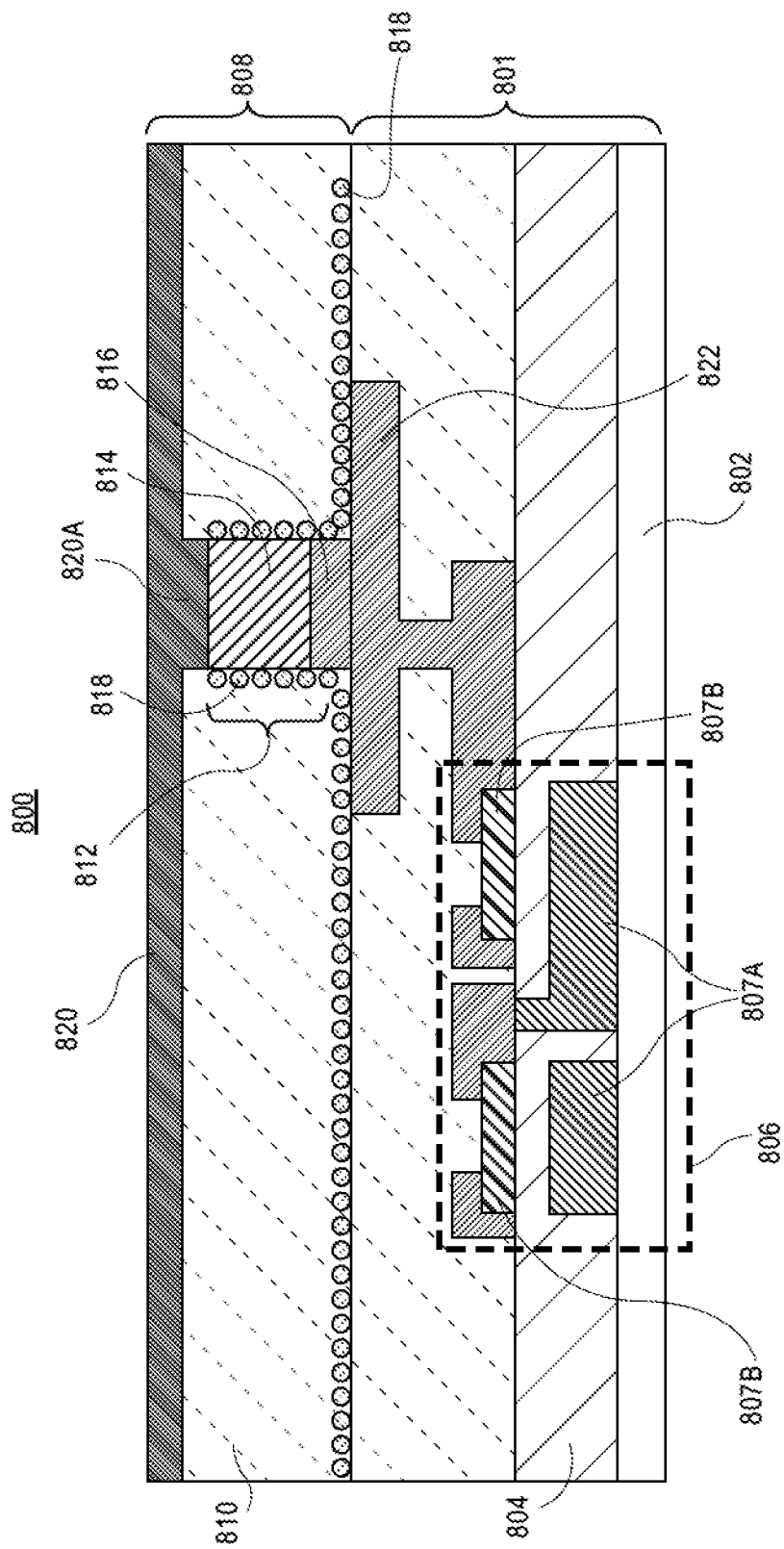
FIG. 8 illustrates a cross-sectional view of a micro LED pixel structure, in accordance with an embodiment of the present disclosure.

Referring to FIG. 8, a pixel structure 800 includes a backplane 801. The backplane 801 includes a glass substrate 802 having an insulating layer 804 thereon. A pixel thin film transistor (TFT) circuit 806 is included in and on the insulating layer 804. The pixel TFT circuit 806 includes one or more gate electrodes 807A, such as one or more metal gate electrodes, and one or more channels 807B, such as polycrystalline silicon channels or IGZO channels. A portion of the insulating layer 804 may act as a gate dielectric for the pixel TFT circuit 806. A conductive mirror/reflector 822 is over the TFT circuit 806.

Referring again to FIG. 8, the pixel structure 800 includes a front plane 808 on the backplane 801. The front plane 808 includes an LED 812 in a dielectric layer 810, such as a carbon-doped oxide layer. A plurality of dielectric nanoparticles 818, such as $TiO_2$ or $ZrO_2$ particles (e.g., each having a diameter in the range of 10 nanometers-300 nanometers), is along sidewalls of the micro light emitting diode device within the dielectric layer 810. The micro LED 812 includes a corresponding micro light emitting diode device 814 on a conductive interconnect structure 816, such as a conductive bump. Micro light emitting diode device 814 can be a blue, green or red micro light emitting diode device. The front plane 808 also includes a transparent conducting oxide layer 820, such as a layer of indium tin oxide (ITO), as a cathode of the pixel structure 800. An extension portion 820A of transparent conducting oxide layer 820 may be included above the micro light emitting diode device 814, as is depicted.

In an embodiment, the pixel TFT circuit 806 is a circuit such as circuit 1200, described below. Embodiments described herein may be based only on the back plane 801 described above. Embodiments described herein may be based only on the front plane 808 described above. It is to be appreciated that a pixel structure may include more than one micro light emitting diode device 814.

To provide further context, it is to be appreciated that light extraction efficiency of a light emitting device composed of semiconductor material is determined by the internal and external quantum efficiencies thereof. Generally, the internal quantum efficiency relates to the characteristics of the material and the epitaxy quality of the device. The external quantum efficiency relates to the reflectivity of the material. The emission efficiency of a traditional nanowire light emitting diode may be limited due to the incomplete emission of the light generated therefrom, which is due to the fact that semiconductor material has, compared to air (n=1.0) or dielectric (e.g., $SiO_2$ or SiOC) surrounding the nanowire, a higher refraction coefficient (e.g. n=2.2 to 3.8). According to Snell's law, if the incident angle of light passing from a high refractive index medium to a low refractive index medium is larger than a critical angle, then the light undergoes total internal reflection such that it cannot enter the low refractive index medium. Most light emitted by a light emitting diode is subjected to the total internal reflection issue so as to decrease the overall emission efficiency of the light emitting diode. One technique used in planar light emitting diodes to minimize the total internal reflection loss is to form a structure having light scattering centers randomly distributed on the surface of a light emitting diode. Roughness or texture is formed on the surface of a planar light emitting diode by a chemical etch agent through a mask. However, the GaN group material may not be easy to process because the GaN group material is highly rigid and has high resistance to effects of acidic and alkaline materials. General chemical agents and organic agents cannot etch the GaN group material. The most common method used for etching the GaN group material is the reactive ion etching process. However, such a method may not be useful to create texture on the sidewalls of a nanowire LED. In addition, a reactive ion etch (RIE) can result in damage of the p-type GaN layer which is not desired. One or more embodiments described herein provides a textured nanowire structure of a nanowire LED device and fabrication thereof, which can provide solutions to the limitations of traditional nanowire LED devices.

Figure 9A:
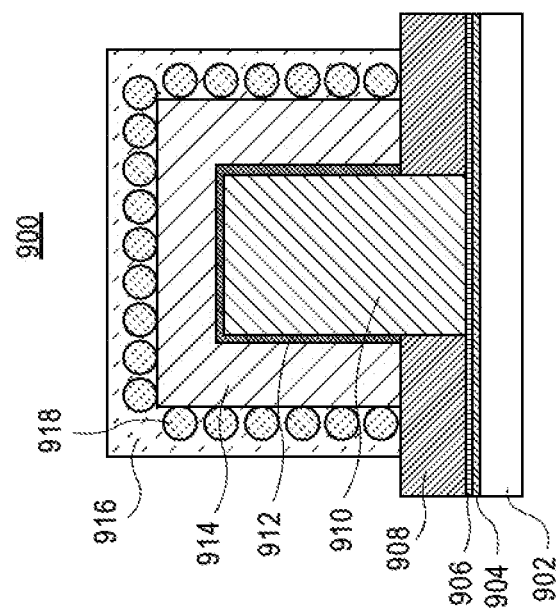
FIG. 9A illustrates a cross-sectional view of a nanowire LED formed on Si(111) wafer and having nanoparticles therein, in accordance with an embodiment of the present disclosure.

As another example, FIG. 9A illustrates a cross-sectional view of a nanowire LED having nanoparticles therein, in accordance with an embodiment of the present disclosure.

Referring to FIG. 9A, an LED structure 900 includes a substrate 902, such as a Si(111) substrate. A buffer layer or first nucleation layer 904, such as an aluminum nitride (AlN) layer, is on substrate 902. A top nucleation layer 906, such as a metal nitride (MN) nucleation layer is on the buffer layer or first nucleation layer 904. A mask or passivation layer 908, such as a silicon nitride layer, is on the top nucleation layer 906. An opening in the mask or passivation layer 908 exposes a portion of the top nucleation layer 906. A nanowire core 910, such as an N-type GaN (N-GaN) nanowire core, is in the opening in the mask or passivation layer 908 and on the exposed portion of the top nucleation layer 906. An active layer 912, such as an InGaN layer, is on exposed portions of the nanowire core 910. A top semiconductor layer 914, such as a P-type GaN (P-GaN) layer is on the active layer 912. A transparent conductive oxide (TCO) layer 916 is on the top semiconductor layer 914. Nanoparticles 918, such as $TiO_2$ particles or $ZrO_2$ particles, are included within or embedded in the TCO layer 916.

Figure 9B:
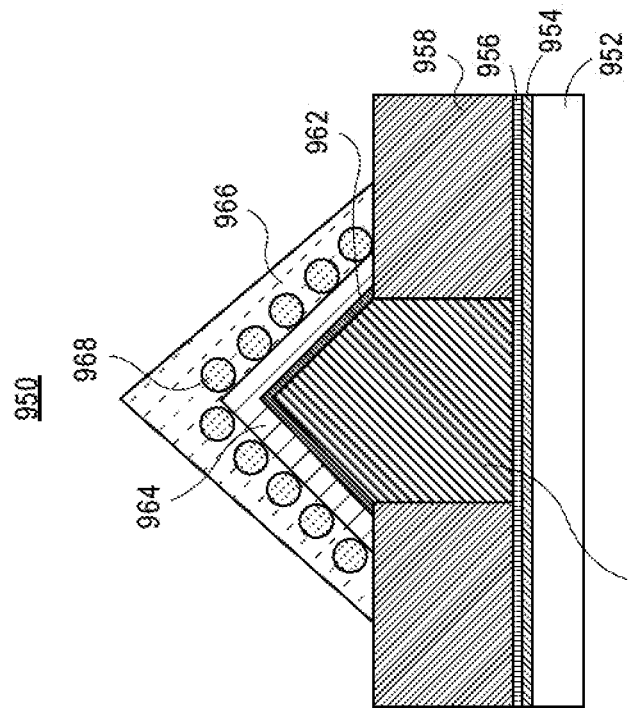
FIG. 9B illustrates a cross-sectional view of a nanopyramid LED formed on Si(111) wafer and having nanoparticles therein, in accordance with an embodiment of the present disclosure.

As another example, FIG. 9B illustrates a cross-sectional view of a nanopyramid LED having nanoparticles therein, in accordance with an embodiment of the present disclosure.

Referring to FIG. 9B, an LED structure 950 includes a substrate 952, such as a Si(111) substrate. A buffer layer or first nucleation layer 954, such as an aluminum nitride (AlN) layer, is on substrate 952. A top nucleation layer 956, such as a metal nitride (MN) nucleation layer is on the buffer layer or first nucleation layer 954. A mask or passivation layer 958, such as a silicon nitride layer, is on the top nucleation layer 956. An opening in the mask or passivation layer 958 exposes a portion of the top nucleation layer 956. A nanopyramid core 960, such as an N-type GaN (N-GaN) nanopyramid core, is in the opening in the mask or passivation layer 958 and on the exposed portion of the top nucleation layer 956. An active layer 962, such as an InGaN layer, is on exposed portions of the nanopyramid core 960. A top semiconductor layer 964, such as a P-type GaN (P-GaN) layer is on the active layer 962. A transparent conductive oxide (TCO) layer 966 is on the top semiconductor layer 964. Nanoparticles 968, such as $TiO_2$ particles or $ZrO_2$ particles, are included within or embedded in the TCO layer 966.

Referring to both FIGS. 9A and 9B, a nanowire or nanopyramid surface is decorated by $TiO_2$ (or the like) nanoparticles to create "subwavelength texture" that results in improved light extraction efficiency. In one such embodiment, the nanoparticles are deposited on a P-GaN layer. As an exemplary resulting structure, a micro light emitting diode pixel structure includes a plurality of micro light emitting diode devices of the type of FIG. 9A or 9B in a dielectric layer. A transparent conducting oxide layer is above the dielectric layer and over the plurality of micro light emitting diode devices. A plurality of dielectric nanoparticles is on the transparent conducting oxide layer and over the plurality of micro light emitting diode devices.

In an embodiment, the dielectric nanoparticles are titanium dioxide ($TiO_2$) particles, silicon dioxide ($SiO_2$) particles, zirconium oxide ($ZrO_2$) particles, or a combination thereof. In an embodiment, the dielectric nanoparticles each have a diameter in the range of 10 nanometers-300 nanometers. In an embodiment, the plurality of micro light emitting diode devices of the type in FIG. 9A or 9B includes a blue micro light emitting diode device, a green micro light emitting diode device, and a red micro light emitting diode device. In an embodiment, the plurality of micro light emitting diode devices is a plurality of GaN nanowire-based or nanopyramid-based micro light emitting diode devices.

In an embodiment, the plurality of micro light emitting diode devices of the type in FIG. 9A or 9B form a front plane of a micro light emitting diode pixel structure, and the micro light emitting diode pixel structure further includes a backplane beneath the front plane. In one embodiment, the backplane includes a glass substrate having an insulating layer thereon, and a plurality of pixel thin film transistor circuits in and on the insulating layer. Each of the pixel thin film transistor circuits includes a gate electrode and a channel which may include polycrystalline silicon or indium gallium zinc oxide (IGZO). In one embodiment, each of the pixel thin film transistor circuits is to drive at least one of the plurality of micro light emitting diode devices. In one embodiment, each of the pixel thin film transistor circuits includes a current mirror and a linearized transconductance amplifier coupled to the current mirror.

It is to be appreciated that approaches for fabricating a micro LED may include the use of red, green and blue micro LEDs fabricated from gallium nitride (GaN). Advantages of implementing one or more embodiments described herein may include one or more of, but need not be limited to: (1) improved light extraction, (2) a significant reduction in internal reflectivity, or (3) enhanced transmission, which serves to assist with light extraction from the device. Embodiments described herein may be implemented to enable large scale µLED display manufacturing that brings together three major separate technologies and supply chain bricks: (1) micro LED manufacturing, (2) display manufacturing, and (3) transfer technology tool manufacturing. In a typical display, each pixel is constituted of Red, Green and Blue (RGB) subpixels controlled independently by a matrix of transistors. The idea behind µLED displays is to use individual, small LED chips as the sub-pixel. Unlike OLEDs, inorganic LED require high processing temperatures (e.g., greater than 1000° C.) and cannot be "grown" and patterned directly on top of the transistor matrix. In most cases, the micro LED chips are therefore manufactured separately then positioned and connected to the transistor matrix via a pick and place process. Many companies and research organizations are currently working on µLED displays. However, volume production at costs compatible with the applications still face multiple engineering and manufacturing challenges. Such challenges include: LED epitaxy quality and homogeneity, efficiency of very small µLEDs, sidewall effects, massively parallel chip transfer technologies (e.g. pick and place) with position accuracy and high throughput, cost, handling of small die, etc., interconnects, color conversion, defect management, supply chain, and cost of production.

Micro LED (µLED) display is a type of emissive display technology that uses a matrix of individually-switched self-illuminating inorganic diodes that can be controlled and lit without a master backlight. Inorganic µLEDs have a number of potential advantages over organic LEDs (OLEDs) for display applications including high brightness, longer lifecycle, and imperviousness to image sticking and burn in. Typically, in µLED displays, a desired color and luminance value are created from various combinations of three colors of light emitting elements (red, green and blue).

It is to be appreciated that due to the inorganic nature of the emitting materials of micro LEDs versus OLEDs, the efficiency and narrow emission bands of µLEDs also offer the prospect of significantly improved performance in terms of: energy consumption, color gamut, brightness, contrast (High Dynamic Range), long lifetime and environmental stability (not sensitive to air, moisture), and compatibility with flexible backplane technologies to enable curved or flexible displays. In addition, µLEDs can deliver extremely high pixel density (up to 5000 PPI).

In one aspect, a display assembly method involves fabricating micro LED displays on silicon wafers. In an embodiment, a manufacturing approach involves first providing two types of wafers. A first wafer includes µLED arrays with a very small pitch (e.g., less than 5 µm) fabricated on, e.g., 300 mm silicon wafers. In an example, red, green and blue LEDs are manufactured monolithically. In one embodiment, the LED active layers are composed of Indium Gallium Nitride (InGaN) with different Indium composition corresponding to different colors (e.g., blue color LEDs have approximately 20% indium (e.g., $In_{0.2}Ga_{0.8}N$), green color LEDs have approximately 30% indium (e.g., $In_{0.3}Ga_{0.7}N$), and red color LEDs have approximately 40% indium (e.g., $In_{0.4}Ga_{0.6}N$)).

A second wafer, such as a 300 mm wafer, is prepared with driver circuit arrays (e.g., corresponding to the µLED arrays mentioned above). The driver circuit arrays may be fabricated to include CMOS devices on silicon wafers (e.g., 22 nm node, 32 nm node, 45 nm node, 65 nm node, 90 nm node, 130 nm node, or 180 nm node). Wafer-to-wafer bonding is then performed to couple the above two wafers using wafer bonding technology with an alignment accuracy of, e.g., ±0.5 µm or better.

As an example, FIGS. 10A-10E illustrate cross-sectional views representing various operations in a method of fabricating a micro light emitting diode pixel structure, in accordance with an embodiment of the present disclosure.

Figure 10A:
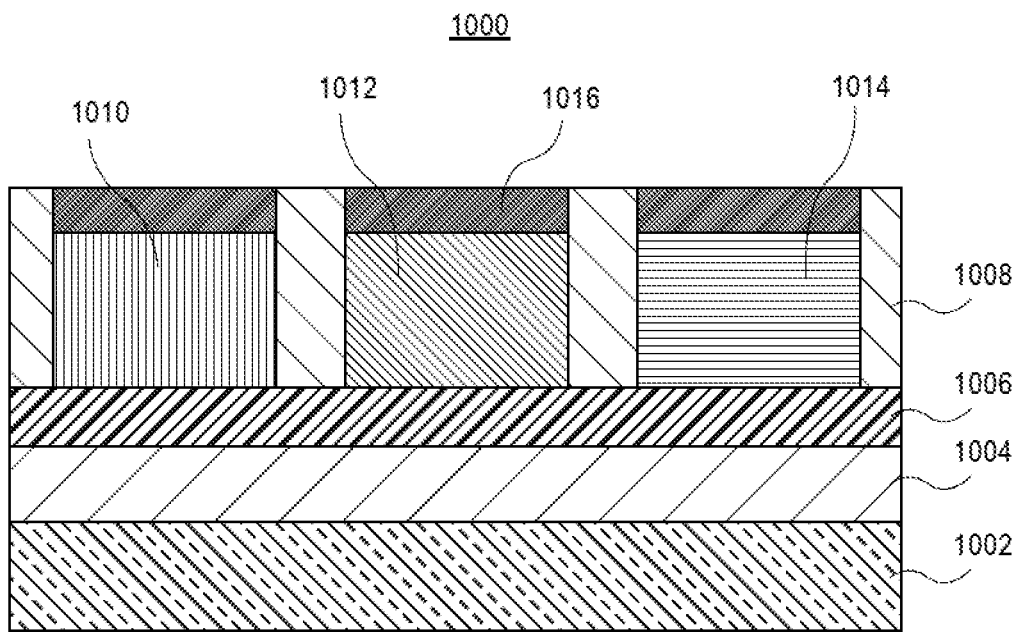

Referring to FIG. 10A, a structure 1000 includes a second wafer 1002, such as silicon wafer having an aluminum nitride (AlN) 1004 and nucleation layer 1006 thereon. Wafer 1002 includes a plurality of micro light emitting diode devices 1010/1012/1014 in a second dielectric 1008 thereon. In one embodiment, the plurality of micro light emitting diode devices includes a red micro light emitting diode device 1010, a green micro light emitting diode device 1012, and a blue micro light emitting diode device 1014. A metal layer 1016, such as a copper layer, may be included as an anode layer, as is depicted.

Figure 10B:
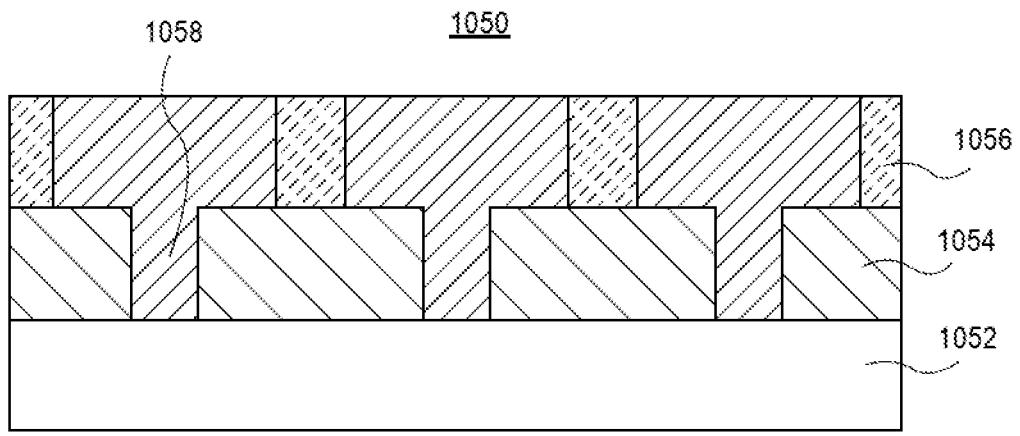

Referring to FIG. 10B, a structure 1050 includes a first wafer 1052 having a plurality of conductive interconnect structures 1058 in a first dielectric layer 1054/1056 thereon. In one embodiment, first dielectric layer 1054/1056 includes a first low-k portion 1054 and a second low-k portion 1056, as is depicted. In one embodiment, the first wafer 1052 is a silicon substrate including metal oxide semiconductor (CMOS) devices or thin film transistor (TFT) devices coupled to the plurality of conductive interconnect structures 1058.

Referring to FIG. 10C, structures 1000 and 1050, i.e., first and second wafers, are coupled to provide individual ones of the plurality of micro light emitting diode devices 1010/1012/1014 electrically coupled to a corresponding one of the plurality of conductive interconnect structures 1058, e.g., by wafer-to-wafer bonding. The bonding may be through metal layer 1016, as is depicted.

Referring to FIG. 10D, the second wafer 1002 (and, if included, layers 1004 and 1006) are removed to expose the plurality of micro light emitting diode devices 1010/1012/1014. Mie scattering particles 1059 are formed on each of the micro light emitting diode devices. The Mie scattering particles 1059 may be formed by selective growth, selective deposition, blanket deposition and etch, etc.

Figure 10E:
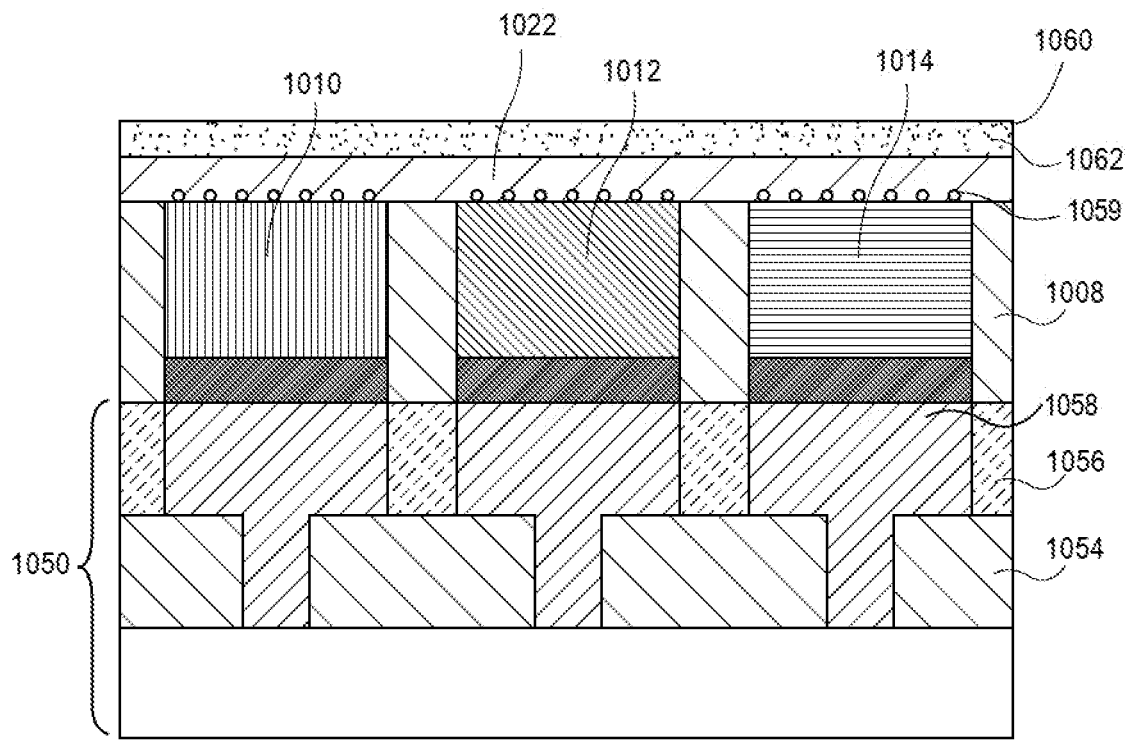

Referring to FIG. 10E, a transparent conducting oxide layer 1022 is formed on the plurality of micro light emitting diode devices 1010/1012/1014, on the second dielectric layer 1008, and on the Mie scattering particles 1059. A binder material layer 1060 is formed above the transparent conducting oxide layer 1022. The binder material layer 1060 has a plurality of Rayleigh scattering particles 1062 therein. The binder material layer 1060 with the plurality of Rayleigh scattering particles 1062 may be formed by spin-on approaches, chemical vapor deposition, etc.

Referring again to FIGS. 10A-10E, a micro light emitting diode pixel structure includes a substrate 1052 having a plurality of conductive interconnect structures 1058 in a first dielectric layer 1054/1056 thereon. A plurality of micro light emitting diode devices 1010/1012/1014 is in a second dielectric layer 1008 above the first dielectric layer 1054/1056. Individual ones of the plurality of micro light emitting diode devices 1010/1012/1014 is electrically coupled to a corresponding one of the plurality of conductive interconnect structures 1058. Each of the micro light emitting diode devices 1010/1012/1014 has Mie scattering particles 1059 thereon. The second dielectric layer 1008 is separate and distinct from the first dielectric layer 1054/1056. A transparent conducting oxide layer 1022 is on the plurality of micro light emitting diode devices 1010/1012/1014 and on the second dielectric layer 1008. A binder material layer 1060 is above the transparent conducting oxide layer 1022. The binder material layer 1062 has a plurality of Rayleigh scattering particles 1062 therein.

In an embodiment, the Mie scattering particles 1059 are titanium dioxide ($TiO_2$) particles. In an embodiment, the Rayleigh scattering particles 1062 are titanium dioxide ($TiO_2$) particles, silicon dioxide ($SiO_2$) particles, or zirconium oxide ($ZrO_2$) particles.

In one embodiment, substrate 1052 is a silicon substrate including metal oxide semiconductor (CMOS) devices or thin film transistor (TFT) devices coupled to the plurality of conductive interconnect structures 1058. In one embodiment, the plurality of micro light emitting diode devices 1010/1012/1014 includes a red micro light emitting diode device 1010, a green micro light emitting diode device 1012, and a blue micro light emitting diode device 1014. In one embodiment, the first 1054/1056 and second 1008 dielectric layers are low-k dielectric layers. In one embodiment, the transparent conducting oxide layer 1022 is an indium tin oxide (ITO) layer.

Figure 11A:
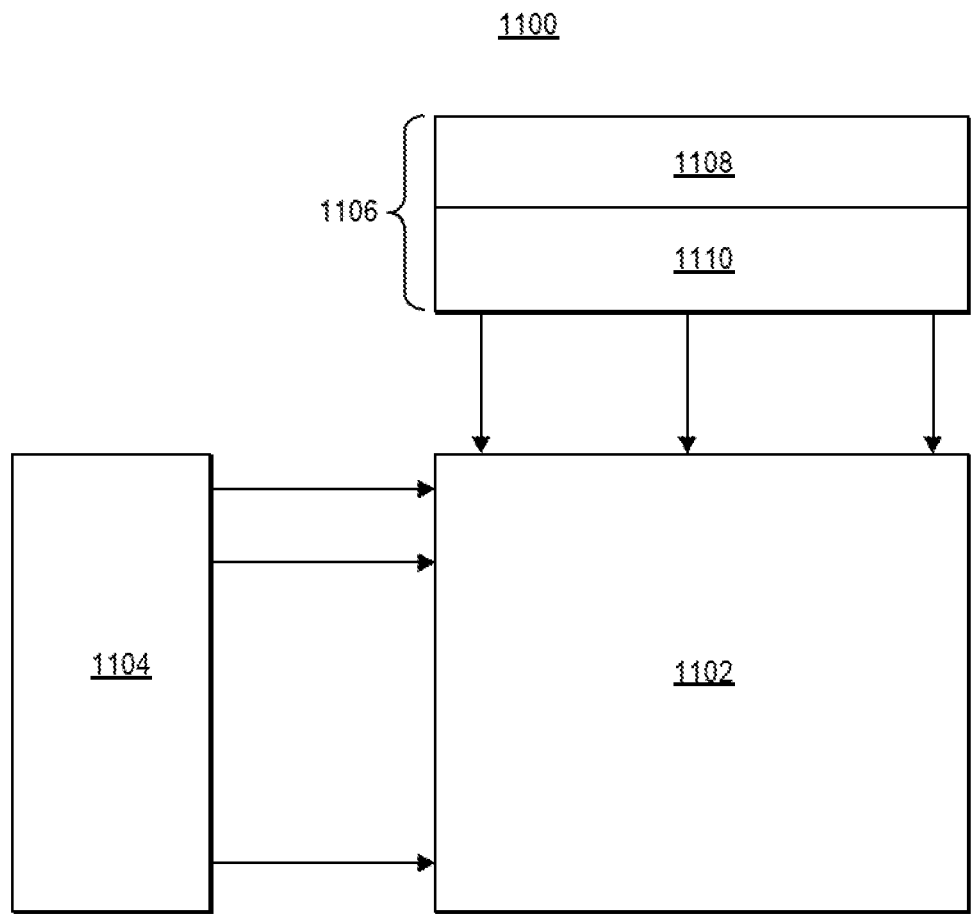
FIG. 11A is a block diagram of driver electronics architecture, in accordance with an embodiment of the present disclosure.

In accordance with one or more embodiments of the present disclosure, a pulse amplitude modulation driving scheme and circuit are described. For example, FIG. 11A is a block diagram 1100 of driver electronics architecture, in accordance with an embodiment of the present disclosure. Referring to the display system schematic of FIG. 11A, a μLED array 1102 (such as an OLED or LED) is driven by a row driver 1104 and a column driver 1106. Each column driver 1106 has a 8 bit SRAM 1108 and a 256 bit DAC or 10 bit PAM 1110. The output of the DAC 1110 is a pulse having an amplitude determined by the current density required to achieve peak power efficacy. The width of the pulse is a function of the integrated current density needed by the micro LED to achieve a desired gray level and brightness.

Figure 11B:
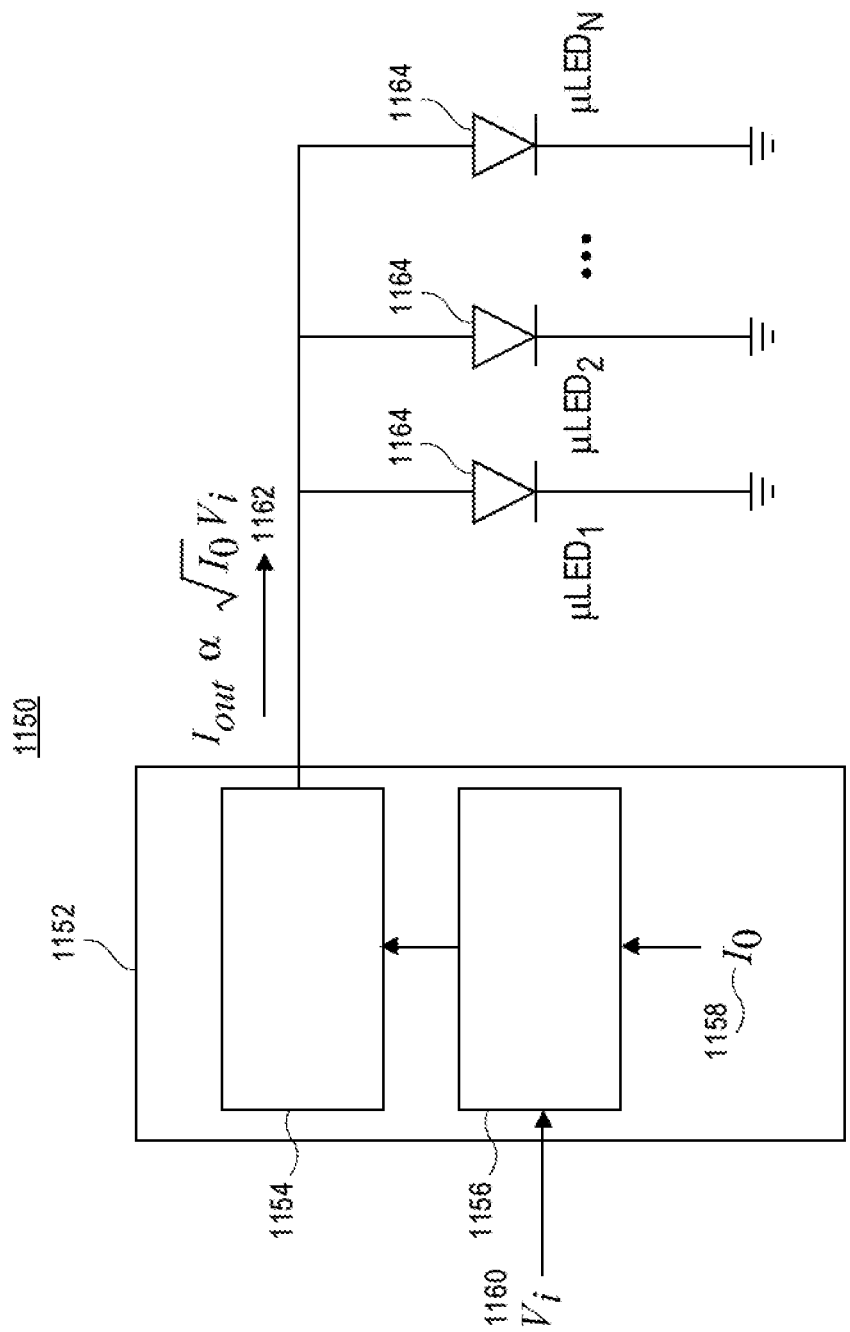
FIG. 11B is a block diagram of a pixel circuit including a linearized transconductance amplifier, in accordance with an embodiment of the present disclosure.

FIG. 11B is a block diagram of a pixel circuit including a linearized transconductance amplifier, in accordance with an embodiment of the present disclosure. Referring to FIG. 11B, a circuit 1150 includes a pixel circuit 1152. Pixel circuit 1152 includes a current mirror 1154 and a linearized transconductance amplifier 1156. A pulsed current source 1158 is provided. Input data 1160 is input to pixel circuit 1152. Output data 1162 is output from pixel circuit 1152 and used to drive one or more micro LED devices 1164.

Figure 12:
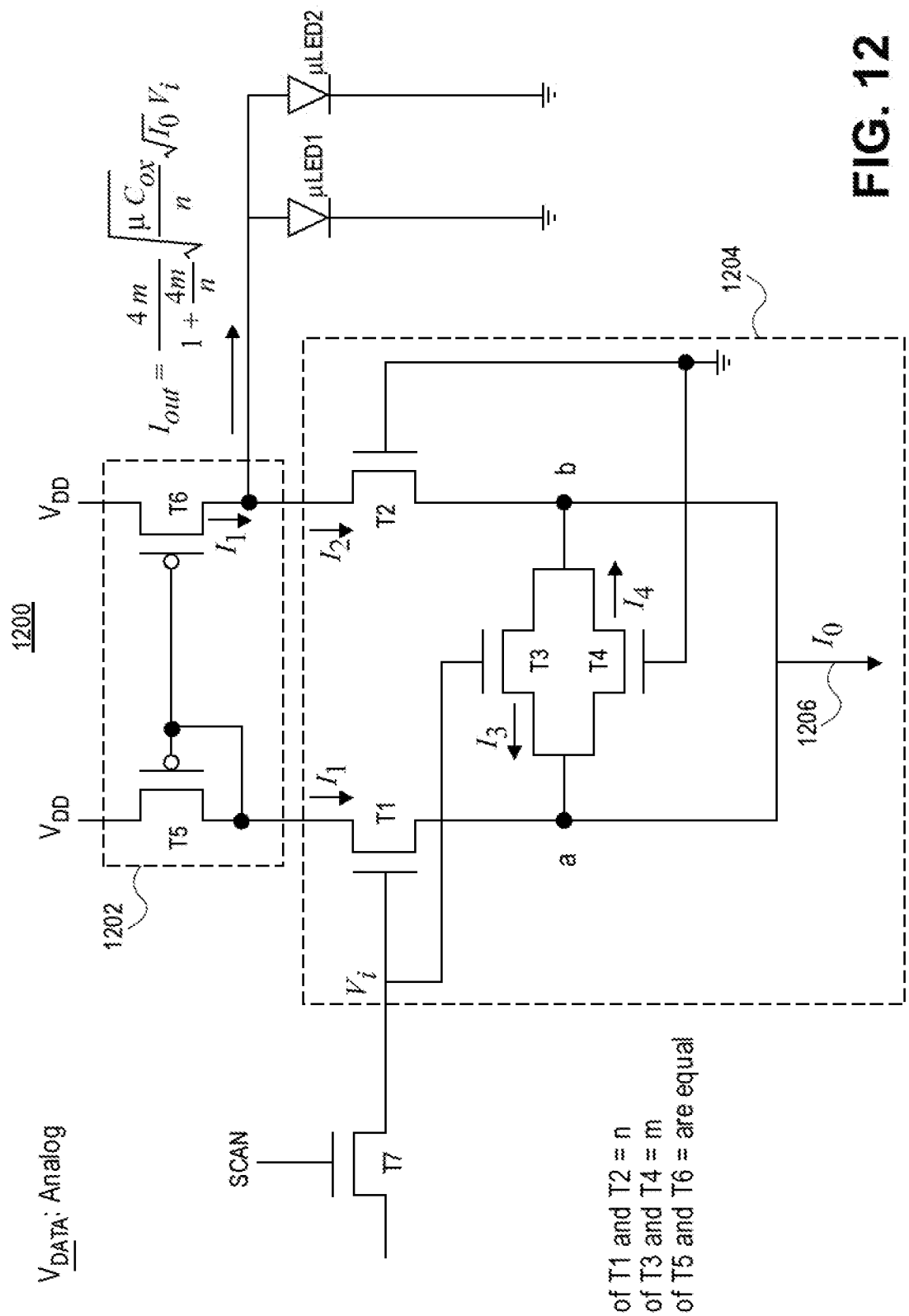
FIG. 12 illustrates a circuit for implementing pulse amplitude modulation, in accordance with an embodiment of the present disclosure.

A capacitor-less pixel driver circuit may be used for high efficiency displays. In an example, FIG. 12 illustrates a circuit 1200 for implementing pulse amplitude modulation, in accordance with an embodiment of the present disclosure. The circuit 1200 includes a current mirror 1202 and a linearized transconductance amplifier 1204. In one embodiment, the current mirror 1202 is based on two P-type transistors, as is depicted. In the pulse amplitude modulation circuit 1200, an input voltage signal is driven by a digital to analog convertor (DAC). The linearized transconductance amplifier 1204 converts the voltage to current. At the bottom of circuit 1200, the current itself gets switched to generate a pulse amplitude modulated current (e.g., bias current 1206) as a pulsed current source. The width of the pulse is fixed by the amount of current density needed for representing a Gray level 1.

To provide further context, μLED arrays produce their own light in response to current flowing through the individual elements of the array. A variety of different LED-like luminescent sources have been used for such displays. One or more embodiments described herein utilize electroluminescent materials in μLEDs made of, for example, GaN, InGaN, or AlInGaP materials. Electrically, such devices behave like diodes with forward "on" voltage drops ranging from 1.9 volts (V) to 5 V, depending on the color and electrode quality.

Unlike liquid crystal displays (LCDs), μLEDs are current driven devices. However, they may be similarly arranged in a two-dimensional array (matrix) of elements to form a display. Active-matrix μLED displays typically use current control circuits integrated with the display itself, with one control circuit corresponding to each individual element on the substrate, to create high-resolution color graphics with a high refresh rate. Such a structure results in a matrix of devices, where one (or more) device is formed at each point where a row overlies a column. There will generally be at least M×N devices in a matrix having M rows and N columns. Typical devices function like light emitting diodes (LEDs), which conduct current and luminesce when voltage of one polarity is imposed across them, and block current when voltage of the opposite polarity is applied. To control such individual μLED devices located at the matrix junctions, it may be useful to have two distinct driver circuits, one to drive the columns and one to drive the rows. It is conventional to sequentially scan the rows (e.g., conventionally connected to device cathodes) with a driver switch to a known voltage such as ground, and to provide another driver to drive the columns (which are conventionally connected to device anodes). In operation, information is transferred to the matrix display by scanning each row in sequence. During each row scan period, each column connected to an element intended to emit light is also driven.

In contrast to conventional integral display architecture based on liquid crystal displays (LCDs), one or more embodiments described herein include the use of a micro LED emissive display which results in overall lower power. Monolithic RGB micro LED wafers may provide full color augmented reality display arrays. Wafer-to-wafer bonding approaches described herein provide a unique device structure that can be easily detected (e.g., metal-to-metal bonding structure and the monolithic RGB pixels). A driver circuit described herein may consume relatively very little area to fit into small pixels of high efficiency displays.

Figure 13:
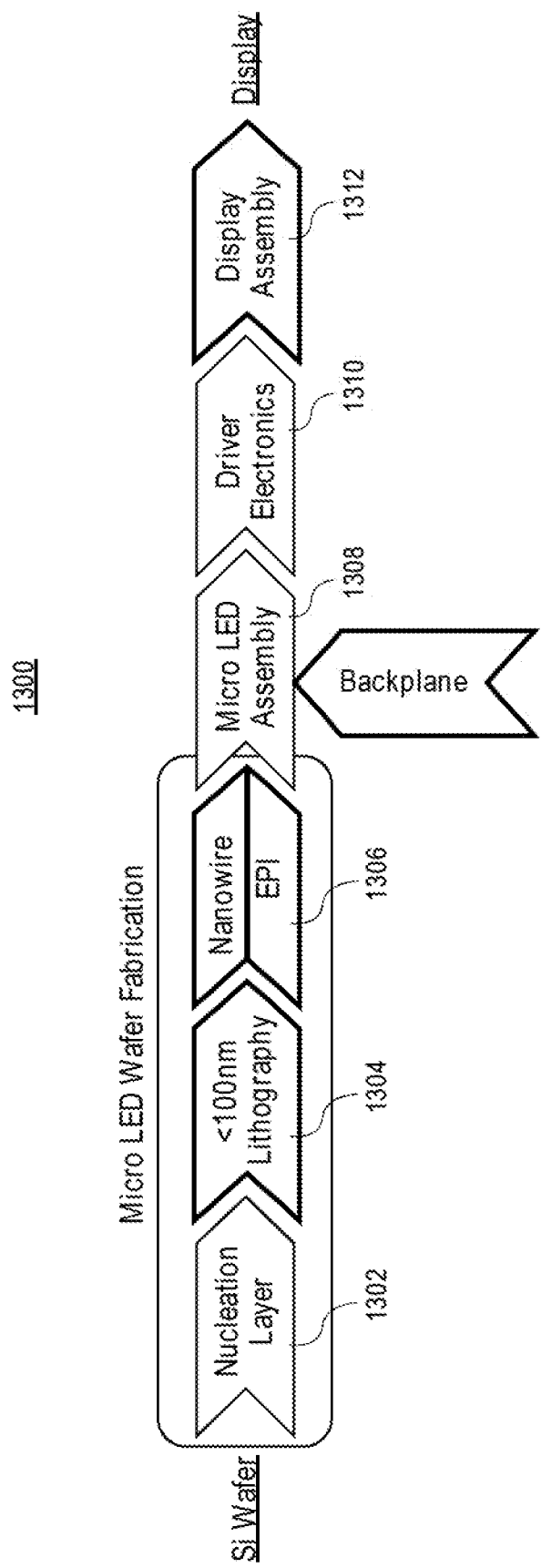
FIG. 13 is a flow diagram illustrating an RGB display production process, in accordance with an embodiment of the present disclosure.

In another aspect, FIG. 13 is a flow diagram 1300 illustrating an RGB display production process, in accordance with an embodiment of the present disclosure. Referring to flow diagram 1300, at operation 1302, a silicon (Si) wafer has a nucleation layer formed thereon, such as a patterned conductive/dielectric nucleation layer. At operation 1304, sub 100 nm lithography is used to pattern a layer on the nucleation layer, or to pattern the nucleation layer. At operation 1306, nanowire growth is performed on the nucleation layer, e.g., by epitaxial deposition. At operation 1308, a backplane is introduced into the micro LED assembly process. At operation 1310, driver electrons are fabricated. At operation 1312, display assembly is performed to finally provide a display.

Figure 14:
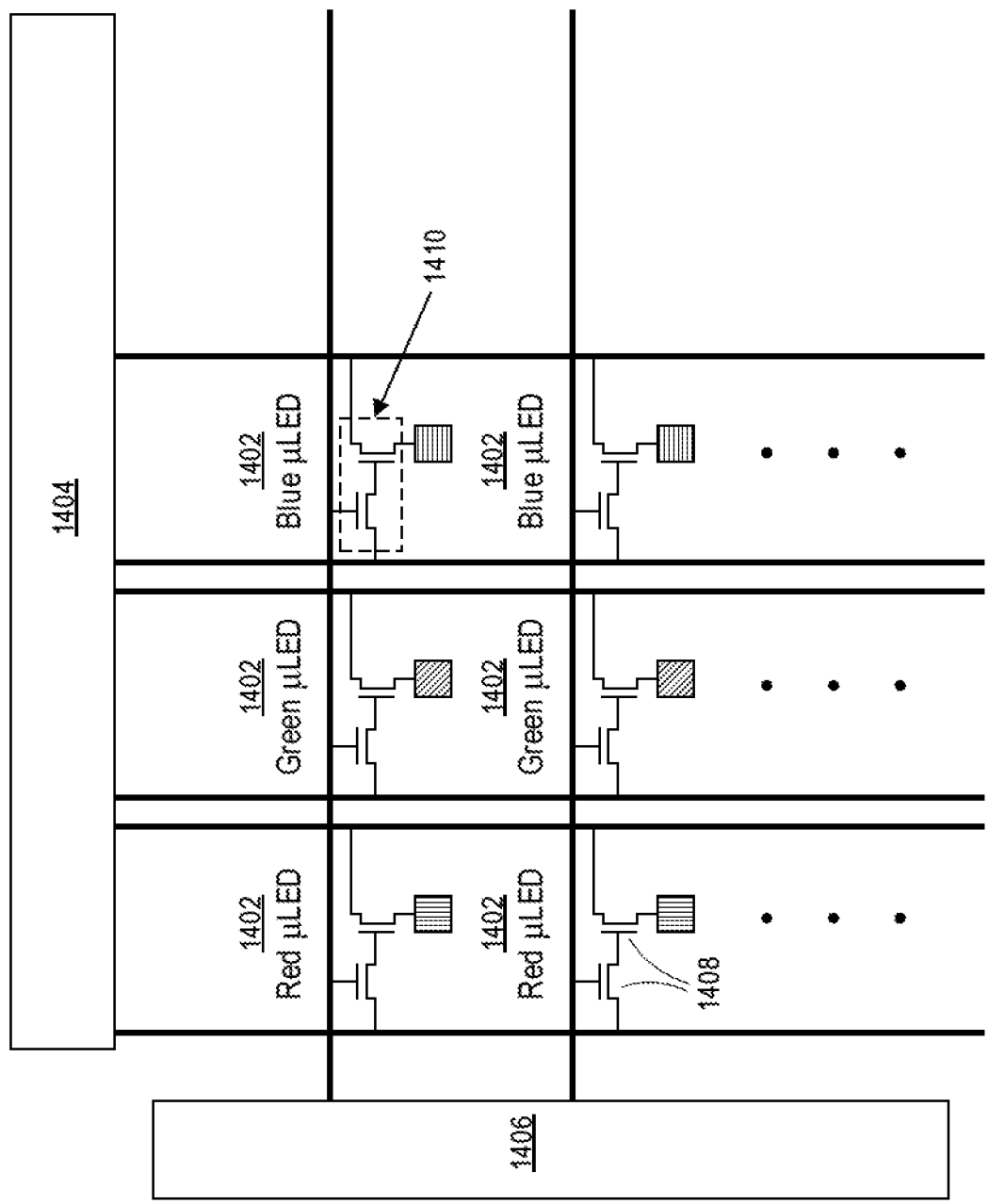
FIG. 14 is a schematic illustration of a display architecture, in accordance with an embodiment of the present disclosure.

FIG. 14 is a schematic illustration of a display architecture, in accordance with an embodiment of the present disclosure. Referring to FIG. 14, micro LEDs 1402 are arranged in a matrix. The micro LEDs are driven through "Data Driver" 1404 and "Scan Driver" 1406 chips. Thin film transistors 1408 are used to make "pixel driver circuits" 1410 for each micro LED. In an embodiment, the micro LEDs are fabricated on a silicon wafer then transferred to a glass substrate called "backplane" where the "pixel driver circuits" 1410 have been fabricated using thin film transistors. Although represented simplistically in FIG. 14, it is to be appreciated that the pixel driver circuits 1410 may be or include a driver circuit such as circuit 1200, described herein.

Figure 15:
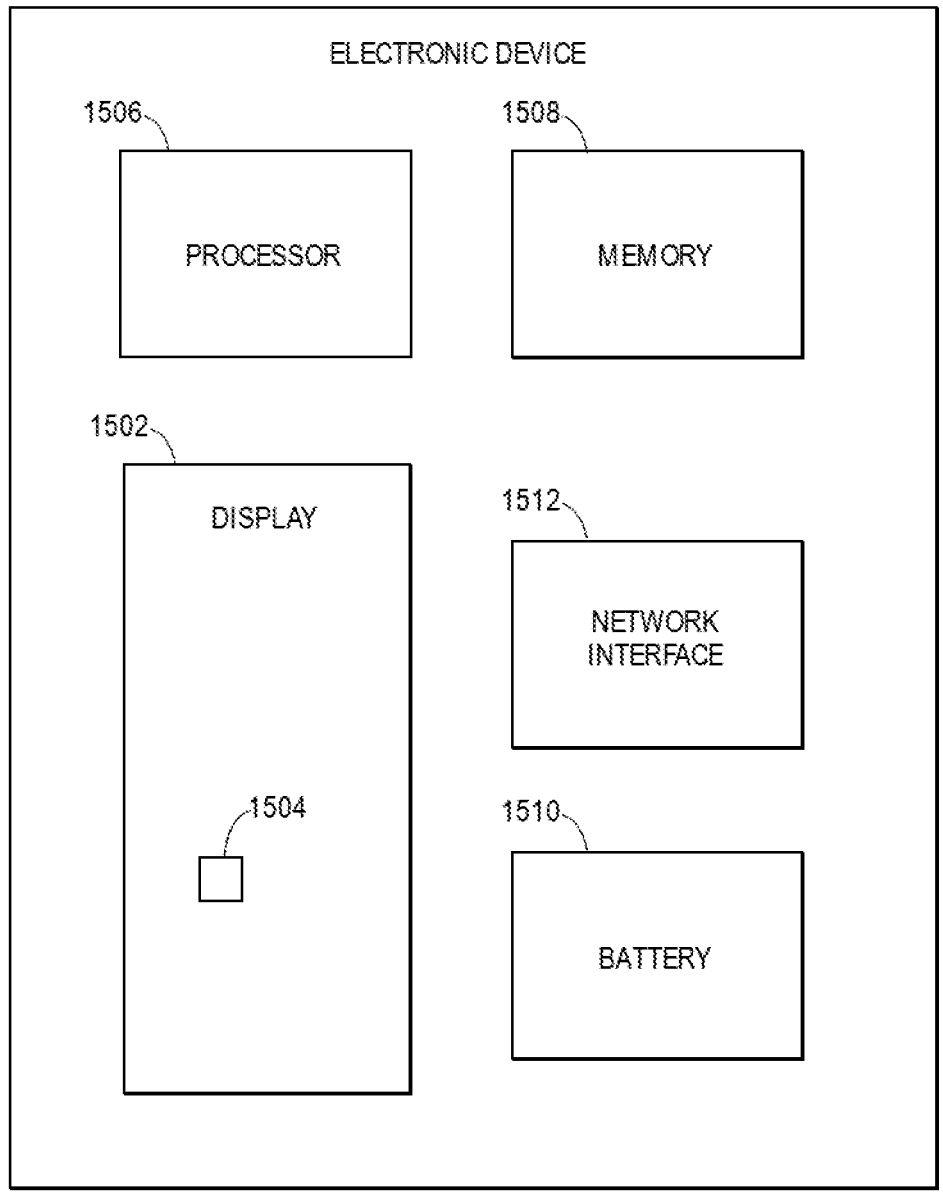
FIG. 15 is an electronic device having a display, in accordance with embodiments of the present disclosure.

FIG. 15 is an electronic device having a display, in accordance with embodiments of the present disclosure. Referring to FIG. 15, an electronic device 1500 has a display or display panel 1502 with a micro-structure 1504. The display may also have glass layers and other layers, circuitry, and so forth. The display panel 1502 may be a micro-LED display panel. As should be apparent, only one microstructure 1504 is depicted for clarity, though a display panel 1502 will have an array or arrays of microstructures including nanowire LEDs.

The electronic device 1500 may be a mobile device such as smartphone, tablet, notebook, smartwatch, and so forth. The electronic device 1500 may be a computing device, stand-alone display, television, display monitor, vehicle computer display, the like. Indeed, the electronic device 1500 may generally be any electronic device having a display or display panel.

The electronic device 1500 may include a processor 1506 (e.g., a central processing unit or CPU) and memory 1508. The memory 1508 may include volatile memory and nonvolatile memory. The processor 1506 or other controller, along with executable code store in the memory 1508, may provide for touchscreen control of the display and well as for other features and actions of the electronic device 1500.

In addition, the electronic device 1500 may include a battery 1510 that powers the electronic device including the display panel 1502. The device 1500 may also include a network interface 1512 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 1500 may include additional components including circuitry and other components.

Thus, embodiments described herein include micro light-emitting diode displays and methods of fabricating micro light-emitting diode displays.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A micro light emitting diode pixel structure includes a plurality of micro light emitting diode devices in a dielectric layer. Each of the micro light emitting diode devices have Mie scattering particles thereon. A transparent conducting oxide layer is above the dielectric layer and on the Mie scattering particles. A binder material layer is above the transparent conducting oxide layer. The binder material layer has a plurality of Rayleigh scattering particles therein.

Example embodiment 2: The micro light emitting diode pixel structure of example embodiment 1, wherein the Mie scattering particles are titanium dioxide ($TiO_2$) particles.

Example embodiment 3: The micro light emitting diode pixel structure of example embodiment 1 or 2, wherein the Mie scattering particles each have a diameter in the range of 0.2-0.5 of the wavelength of light of one or more of the plurality of micro light emitting diode devices.

Example embodiment 4: The micro light emitting diode pixel structure of example embodiment 1, 2 or 3, wherein the Rayleigh scattering particles are titanium dioxide ($TiO_2$) particles, silicon dioxide ($SiO_2$) particles, or zirconium oxide ($ZrO_2$) particles.

Example embodiment 5: The micro light emitting diode pixel structure of example embodiment 1, 2, 3 or 4, wherein the Rayleigh scattering particles have a diameter in the range of 4 nanometers-15 nanometers.

Example embodiment 6: The micro light emitting diode pixel structure of example embodiment 1, 2, 3, 4 or 5, wherein the binder material layer is transparent to visible light and has a refractive index between 1.2 and 1.5.

Example embodiment 7: The micro light emitting diode pixel structure of example embodiment 1, 2, 3, 4, 5 or 6, wherein the binder material layer is selected from the group consisting of an epoxy layer, a polycarbonate layer, and a polyolefin layer.

Example embodiment 8: The micro light emitting diode pixel structure of example embodiment 1, 2, 3, 4, 5, 6 or 7, wherein the plurality of micro light emitting diode devices includes a blue micro light emitting diode device, a green micro light emitting diode device, and a red micro light emitting diode device.

Example embodiment 9: The micro light emitting diode pixel structure of example embodiment 1, 2, 3, 4, 5, 6, 7 or 8, wherein the plurality of micro light emitting diode devices is a plurality of GaN nanowire-based or nanopyramid-based micro light emitting diode devices.

Example embodiment 10: The micro light emitting diode pixel structure of example embodiment 1, 2, 3, 4, 5, 6, 7, 8 or 9, wherein the plurality of micro light emitting diode devices, the transparent conducting oxide layer, and the binder material layer form a front plane of the micro light emitting diode pixel structure, and wherein the micro light emitting diode pixel structure further includes a backplane beneath the front plane. The backplane includes a glass substrate having an insulating layer thereon, and a plurality of pixel thin film transistor circuits in and on the insulating layer. Each of the pixel thin film transistor circuits includes a gate electrode and a channel including polycrystalline silicon or indium gallium zinc oxide (IGZO).

Example embodiment 11: The micro light emitting diode pixel structure of example embodiment 10, wherein each of the pixel thin film transistor circuits is to drive at least one of the plurality of micro light emitting diode devices.

Example embodiment 12: The micro light emitting diode pixel structure of example embodiment 10 or 11, wherein each of the pixel thin film transistor circuits includes a current mirror and a linearized transconductance amplifier coupled to the current mirror.

Example embodiment 13: A micro light emitting diode pixel structure includes a substrate having a plurality of conductive interconnect structures in a first dielectric layer thereon. A plurality of micro light emitting diode devices is in a second dielectric layer above the first dielectric layer. Each of the micro light emitting diode devices has Mie scattering particles thereon. Individual ones of the plurality of micro light emitting diode devices are electrically coupled to a corresponding one of the plurality of conductive interconnect structures. The second dielectric layer is separate and distinct from the first dielectric layer. A transparent conducting oxide layer is on the plurality of micro light emitting diode devices and on the second dielectric layer. A binder material layer is above the transparent conducting oxide layer, the binder material layer having a plurality of Rayleigh scattering particles therein.

Example embodiment 14: The micro light emitting diode pixel structure of example embodiment 13, wherein the substrate is a silicon substrate including metal oxide semiconductor (CMOS) devices or thin film transistor (TFT) devices coupled to the plurality of conductive interconnect structures.

Example embodiment 15: The micro light emitting diode pixel structure of example embodiment 13 or 14, wherein the plurality of micro light emitting diode devices includes a red micro light emitting diode device, a green micro light emitting diode device, and a blue micro light emitting diode device.

Example embodiment 16: The micro light emitting diode pixel structure of example embodiment 13, 14 or 15, wherein the Mie scattering particles are titanium dioxide ($TiO_2$) particles.

Example embodiment 17: The micro light emitting diode pixel structure of example embodiment 13, 14, 15 or 16, wherein the Rayleigh scattering particles are titanium dioxide ($TiO_2$) particles, silicon dioxide ($SiO_2$) particles, or zirconium oxide ($ZrO_2$) particles.

Example embodiment 18: A method of fabricating a micro light emitting diode pixel structure includes providing a first wafer having a plurality of conductive interconnect structures in a first dielectric layer thereon. The method also includes providing a second wafer having a plurality of micro light emitting diode devices in a second dielectric thereon. The method also includes coupling the first and second wafers to provide individual ones of the plurality of micro light emitting diode devices electrically coupled to a corresponding one of the plurality of conductive interconnect structures. The method also includes removing the second wafer. The method also includes forming Mie scattering particles on each of the micro light emitting diode devices. The method also includes forming a transparent conducting oxide layer on the plurality of micro light emitting diode devices and on the second dielectric layer. The method also includes forming a binder material layer above the transparent conducting oxide layer, the binder material layer having a plurality of Rayleigh scattering particles therein.

Example embodiment 19: The method of example embodiment 18, wherein the first wafer is a silicon substrate including metal oxide semiconductor (CMOS) devices or thin film transistor (TFT) devices coupled to the plurality of conductive interconnect structures.

Example embodiment 20: The method of example embodiment 18 or 19, wherein the plurality of micro light emitting diode devices includes a red micro light emitting diode device, a green micro light emitting diode device, and a blue micro light emitting diode device.

Example embodiment 21: A micro light emitting diode pixel structure includes a plurality of micro light emitting diode devices in a dielectric layer. A transparent conducting oxide layer is above the dielectric layer and over the plurality of micro light emitting diode devices. A plurality of dielectric nanoparticles is on the transparent conducting oxide layer and over the plurality of micro light emitting diode devices.

Example embodiment 22: The micro light emitting diode pixel structure of example embodiment 21, wherein the dielectric nanoparticles are titanium dioxide ($TiO_2$) particles, silicon dioxide ($SiO_2$) particles, zirconium oxide ($ZrO_2$) particles, or a combination thereof.

Example embodiment 23: The micro light emitting diode pixel structure of example embodiment 21 or 22, wherein the dielectric nanoparticles each have a diameter in the range of 10 nanometers-300 nanometers.

Example embodiment 24: The micro light emitting diode pixel structure of example embodiment 21, 22 or 23, wherein the plurality of micro light emitting diode devices includes a blue micro light emitting diode device, a green micro light emitting diode device, and a red micro light emitting diode device.

Example embodiment 25: The micro light emitting diode pixel structure of example embodiment 21, 22, 23 or 24, wherein the plurality of micro light emitting diode devices is a plurality of GaN nanowire-based or nanopyramid-based micro light emitting diode devices.

Example embodiment 26: The micro light emitting diode pixel structure of example embodiment 21, 22, 23, 24 or 25, wherein the plurality of micro light emitting diode devices forms a front plane of the micro light emitting diode pixel structure, and wherein the micro light emitting diode pixel structure further includes a backplane beneath the front plane. The backplane includes a glass substrate having an insulating layer thereon, and a plurality of pixel thin film transistor circuits in and on the insulating layer. Each of the pixel thin film transistor circuits includes a gate electrode and a channel including polycrystalline silicon or indium gallium zinc oxide (IGZO).

Example embodiment 27: The micro light emitting diode pixel structure of example embodiment 26, wherein each of the pixel thin film transistor circuits is to drive at least one of the plurality of micro light emitting diode devices.

Example embodiment 28: The micro light emitting diode pixel structure of example embodiment 26 or 27, wherein each of the pixel thin film transistor circuits includes a current mirror and a linearized transconductance amplifier coupled to the current mirror.

Example embodiment 29: A micro light emitting diode pixel structure includes a plurality of micro light emitting diode devices in a dielectric layer. A transparent conducting oxide layer is above the dielectric layer and over the plurality of micro light emitting diode devices. A plurality of dielectric nanoparticles is in the transparent conducting oxide layer and over the plurality of micro light emitting diode devices.

Example embodiment 30: The micro light emitting diode pixel structure of example embodiment 29, wherein the dielectric nanoparticles are titanium dioxide ($TiO_2$) particles, silicon dioxide ($SiO_2$) particles, zirconium oxide ($ZrO_2$) particles, or a combination thereof.

Example embodiment 31: The micro light emitting diode pixel structure of example embodiment 29 or 30, wherein the dielectric nanoparticles each have a diameter in the range of 10 nanometers-300 nanometers.

Example embodiment 32: The micro light emitting diode pixel structure of example embodiment 29, 30 or 31, wherein the plurality of micro light emitting diode devices includes a blue micro light emitting diode device, a green micro light emitting diode device, and a red micro light emitting diode device.

Example embodiment 33: The micro light emitting diode pixel structure of example embodiment 29, 30, 31 or 32, wherein the plurality of micro light emitting diode devices is a plurality of GaN nanowire-based or nanopyramid-based micro light emitting diode devices.

Example embodiment 34: The micro light emitting diode pixel structure of example embodiment 29, 30, 31, 32 or 33, wherein the plurality of micro light emitting diode devices forms a front plane of the micro light emitting diode pixel structure, and wherein the micro light emitting diode pixel structure further includes a backplane beneath the front plane. The backplane includes a glass substrate having an insulating layer thereon, and a plurality of pixel thin film transistor circuits in and on the insulating layer. Each of the pixel thin film transistor circuits includes a gate electrode and a channel including polycrystalline silicon or indium gallium zinc oxide (IGZO).

Example embodiment 35: The micro light emitting diode pixel structure of example embodiment 34, wherein each of the pixel thin film transistor circuits is to drive at least one of the plurality of micro light emitting diode devices.

Example embodiment 36: The micro light emitting diode pixel structure of example embodiment 34 or 35, wherein each of the pixel thin film transistor circuits includes a current mirror and a linearized transconductance amplifier coupled to the current mirror.

Example embodiment 37: A micro light emitting diode pixel structure includes a plurality of micro light emitting diode devices in a dielectric layer. A plurality of dielectric nanoparticles is along sidewalls of each of the plurality of micro light emitting diode devices within the dielectric layer. A transparent conducting oxide layer is above the dielectric layer and over the plurality of micro light emitting diode devices.

Example embodiment 38: The micro light emitting diode pixel structure of example embodiment 37, wherein the dielectric nanoparticles are titanium dioxide ($TiO_2$) particles, silicon dioxide ($SiO_2$) particles, zirconium oxide ($ZrO_2$) particles, or a combination thereof.

Example embodiment 39: The micro light emitting diode pixel structure of example embodiment 37 or 38, wherein the dielectric nanoparticles each have a diameter in the range of 10 nanometers-300 nanometers.

Example embodiment 40: The micro light emitting diode pixel structure of example embodiment 37, 38 or 39, wherein the plurality of micro light emitting diode devices includes a blue micro light emitting diode device, a green micro light emitting diode device, and a red micro light emitting diode device.

Example embodiment 41: The micro light emitting diode pixel structure of example embodiment 37, 38, 39 or 40, wherein the plurality of micro light emitting diode devices is a plurality of GaN nanowire-based or nanopyramid-based micro light emitting diode devices.

Example embodiment 42: The micro light emitting diode pixel structure of example embodiment 37, 38, 39, 40 or 41, wherein the plurality of micro light emitting diode devices and the transparent conducting oxide layer form a front plane of the micro light emitting diode pixel structure, and wherein the micro light emitting diode pixel structure further includes a backplane beneath the front plane. The backplane includes a glass substrate having an insulating layer thereon, and a plurality of pixel thin film transistor circuits in and on the insulating layer. Each of the pixel thin film transistor circuits includes a gate electrode and a channel including polycrystalline silicon or indium gallium zinc oxide (IGZO).

Example embodiment 43: The micro light emitting diode pixel structure of example embodiment 42, wherein each of the pixel thin film transistor circuits is to drive at least one of the plurality of micro light emitting diode devices.

Example embodiment 44: The micro light emitting diode pixel structure of example embodiment 42 or 43, wherein each of the pixel thin film transistor circuits includes a current mirror and a linearized transconductance amplifier coupled to the current mirror.

What is claimed is:

1. A micro light emitting diode pixel structure, comprising:
   a plurality of micro light emitting diode devices in a dielectric layer, each of the micro light emitting diode devices having Mie scattering particles directly thereon;
   a transparent conducting oxide layer above the dielectric layer and on the Mie scattering particles; and
   a binder material layer above the transparent conducting oxide layer, the binder material layer having a plurality of Rayleigh scattering particles therein.

2. The micro light emitting diode pixel structure of claim 1, wherein the Mie scattering particles are titanium dioxide ($TiO_2$) particles.

3. The micro light emitting diode pixel structure of claim 1, wherein the Mie scattering particles each have a diameter in the range of 0.2-0.5 of the wavelength of light of one or more of the plurality of micro light emitting diode devices.

4. The micro light emitting diode pixel structure of claim 1, wherein the Rayleigh scattering particles are titanium dioxide ($TiO_2$) particles, silicon dioxide ($SiO_2$) particles, or zirconium oxide ($ZrO_2$) particles.

5. The micro light emitting diode pixel structure of claim 1, wherein the Rayleigh scattering particles have a diameter in the range of 4 nanometers-15 nanometers.

6. The micro light emitting diode pixel structure of claim 1, wherein the binder material layer is transparent to visible light and has a refractive index between 1.2 and 1.5.

7. The micro light emitting diode pixel structure of claim 1, wherein the binder material layer is selected from the group consisting of an epoxy layer, a polycarbonate layer, and a polyolefin layer.

8. The micro light emitting diode pixel structure of claim 1, wherein the plurality of micro light emitting diode devices comprises a blue micro light emitting diode device, a green micro light emitting diode device, and a red micro light emitting diode device.

9. The micro light emitting diode pixel structure of claim 1, wherein the plurality of micro light emitting diode devices is a plurality of GaN nanowire-based or nanopyramid-based micro light emitting diode devices.

10. The micro light emitting diode pixel structure of claim 1, wherein the plurality of micro light emitting diode devices, the transparent conducting oxide layer, and the binder material layer form a front plane of the micro light emitting diode pixel structure, and wherein the micro light emitting diode pixel structure further comprises a backplane beneath the front plane, the backplane comprising:
a glass substrate having an insulating layer thereon; and
a plurality of pixel thin film transistor circuits in and on the insulating layer, each of the pixel thin film transistor circuits comprising a gate electrode and a channel comprising polycrystalline silicon or indium gallium zinc oxide (IGZO).

11. The micro light emitting diode pixel structure of claim 10, wherein each of the pixel thin film transistor circuits is to drive at least one of the plurality of micro light emitting diode devices.

12. The micro light emitting diode pixel structure of claim 10, wherein each of the pixel thin film transistor circuits comprises a current mirror and a linearized transconductance amplifier coupled to the current mirror.

13. A micro light emitting diode pixel structure, comprising:
a substrate having a plurality of conductive interconnect structures in a first dielectric layer thereon;
a plurality of micro light emitting diode devices in a second dielectric layer above the first dielectric layer, each of the micro light emitting diode devices having Mie scattering particles directly thereon, individual ones of the plurality of micro light emitting diode devices electrically coupled to a corresponding one of the plurality of conductive interconnect structures, wherein the second dielectric layer is separate and distinct from the first dielectric layer;
a transparent conducting oxide layer on the plurality of micro light emitting diode devices and on the second dielectric layer; and
a binder material layer above the transparent conducting oxide layer, the binder material layer having a plurality of Rayleigh scattering particles therein.

14. The micro light emitting diode pixel structure of claim 13, wherein the substrate is a silicon substrate comprising metal oxide semiconductor (CMOS) devices or thin film transistor (TFT) devices coupled to the plurality of conductive interconnect structures.

15. The micro light emitting diode pixel structure of claim 13, wherein the plurality of micro light emitting diode devices comprises a red micro light emitting diode device, a green micro light emitting diode device, and a blue micro light emitting diode device.

16. The micro light emitting diode pixel structure of claim 13, wherein the Mie scattering particles are titanium dioxide (TiO$_2$) particles.

17. The micro light emitting diode pixel structure of claim 13, wherein the Rayleigh scattering particles are titanium dioxide (TiO$_2$) particles, silicon dioxide (SiO$_2$) particles, or zirconium oxide (ZrO$_2$) particles.

18. A method of fabricating a micro light emitting diode pixel structure, the method comprising:
providing a first wafer having a plurality of conductive interconnect structures in a first dielectric layer thereon;
providing a second wafer having a plurality of micro light emitting diode devices in a second dielectric thereon;
coupling the first and second wafers to provide individual ones of the plurality of micro light emitting diode devices electrically coupled to a corresponding one of the plurality of conductive interconnect structures;
removing the second wafer;
forming Mie scattering particles on each of the micro light emitting diode devices;
forming a transparent conducting oxide layer on the plurality of micro light emitting diode devices and on the second dielectric layer; and
forming a binder material layer above the transparent conducting oxide layer, the binder material layer having a plurality of Rayleigh scattering particles therein.

19. The method of claim 18, wherein the first wafer is a silicon substrate comprising metal oxide semiconductor (CMOS) devices or thin film transistor (TFT) devices coupled to the plurality of conductive interconnect structures.

20. The method of claim 18, wherein the plurality of micro light emitting diode devices comprises a red micro light emitting diode device, a green micro light emitting diode device, and a blue micro light emitting diode device.

21. A micro light emitting diode pixel structure, comprising:
a plurality of micro light emitting diode devices in a dielectric layer;
a transparent conducting oxide layer above the dielectric layer and over the plurality of micro light emitting diode devices; and
a plurality of dielectric nanoparticles, a first portion of the plurality of dielectric nanoparticles on or in the transparent conducting oxide layer and over the plurality of micro light emitting diode devices, and a second portion of the plurality of nanoparticles directly on one or more of the plurality of micro light emitting diode devices.

22. The micro light emitting diode pixel structure of claim 21, wherein the dielectric nanoparticles are titanium dioxide (TiO$_2$) particles, silicon dioxide (SiO$_2$) particles, zirconium oxide (ZrO$_2$) particles, or a combination thereof.

23. The micro light emitting diode pixel structure of claim 21, wherein the dielectric nanoparticles each have a diameter in the range of 10 nanometers-300 nanometers.

24. The micro light emitting diode pixel structure of claim 21, wherein the plurality of micro light emitting diode devices comprises a blue micro light emitting diode device, a green micro light emitting diode device, and a red micro light emitting diode device.

25. The micro light emitting diode pixel structure of claim 21, wherein the plurality of micro light emitting diode devices is a plurality of GaN nanowire-based or nanopyramid-based micro light emitting diode devices.

* * * * *